(12) United States Patent
Tang et al.

(10) Patent No.: US 6,542,221 B1
(45) Date of Patent: Apr. 1, 2003

(54) INTEGRATED CIRCUIT SYSTEM WITH AUTOMATED BEST FOCUS DETERMINATION BASED ON CHANGE IN ALIGNMENT DUE TO PREDICTABLE PATTERN DEGRADATION

(75) Inventors: Zhicheng Tang, Plano, TX (US); Roger M. Terry, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 117 days.

(21) Appl. No.: 09/672,531

(22) Filed: Sep. 28, 2000

Related U.S. Application Data

(60) Provisional application No. 60/167,274, filed on Nov. 24, 1999.

(51) Int. Cl.$^7$ .................. G03B 27/52; G03B 27/42; G03B 27/32; G03B 27/54; G03F 9/00
(52) U.S. Cl. .................. 355/55; 355/53; 355/67; 355/77; 430/5; 430/22; 430/30; 430/311; 430/312
(58) Field of Search .................. 355/53, 55, 67, 355/77; 430/5, 22, 30, 311, 312

(56) References Cited

U.S. PATENT DOCUMENTS 5,362,585 A * 11/1994 Adams 5,989,764 A * 11/1999 Adams

* cited by examiner

Primary Examiner—Russell Adams
Assistant Examiner—Khaled Brown
(74) Attorney, Agent, or Firm—Yingshang Tung; Wade James Brady, III; Frederick J. Telecky, Jr.

(57) ABSTRACT

A method (40) of determining a best focus for an integrated circuit stepper (10). The method repeats various steps for a plurality of different focus levels. The repeated steps include forming a first element group (C1) on a wafer ($30_{F1}$), where the first element group comprises one or more elements and each of the one or more elements in the first element group has a shape. The repeated steps further include defining a first reference point ($C_{C1}$) for the first element group at a position relative to the shape of the one or more elements in the first element group. Similarly, the repeated steps include forming a second element group (C2) on the wafer, where the second group comprises one or more elements and each of the one or more elements in the second element group has a shape, and defining a second reference point ($C_{C2}$) for the second element group at a position relative to the shape of the one or more elements in the second element group. Still another repeated step is measuring a distance between the first reference point and the second reference point such that a distance measurement is identified for each of the plurality of different focus levels. Finally, the method selects as the best focus a focus level from the plurality of different focus levels and corresponding to a selected one of the distance measurements.

20 Claims, 10 Drawing Sheets

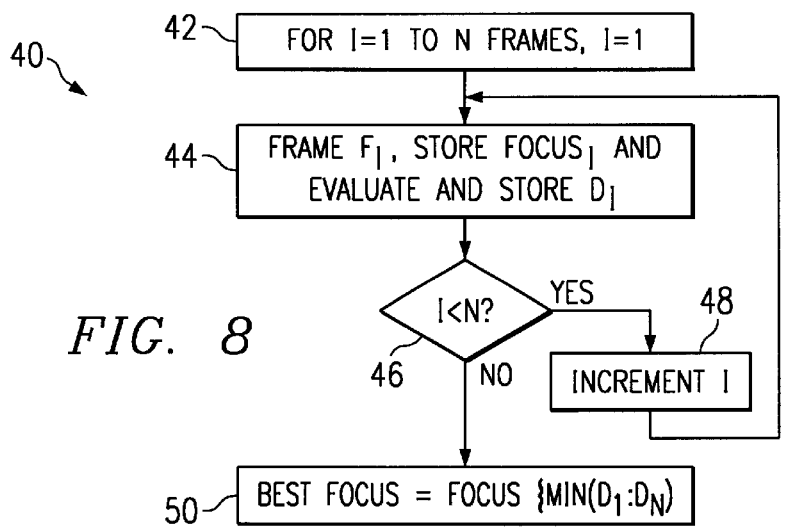
FIG. 8
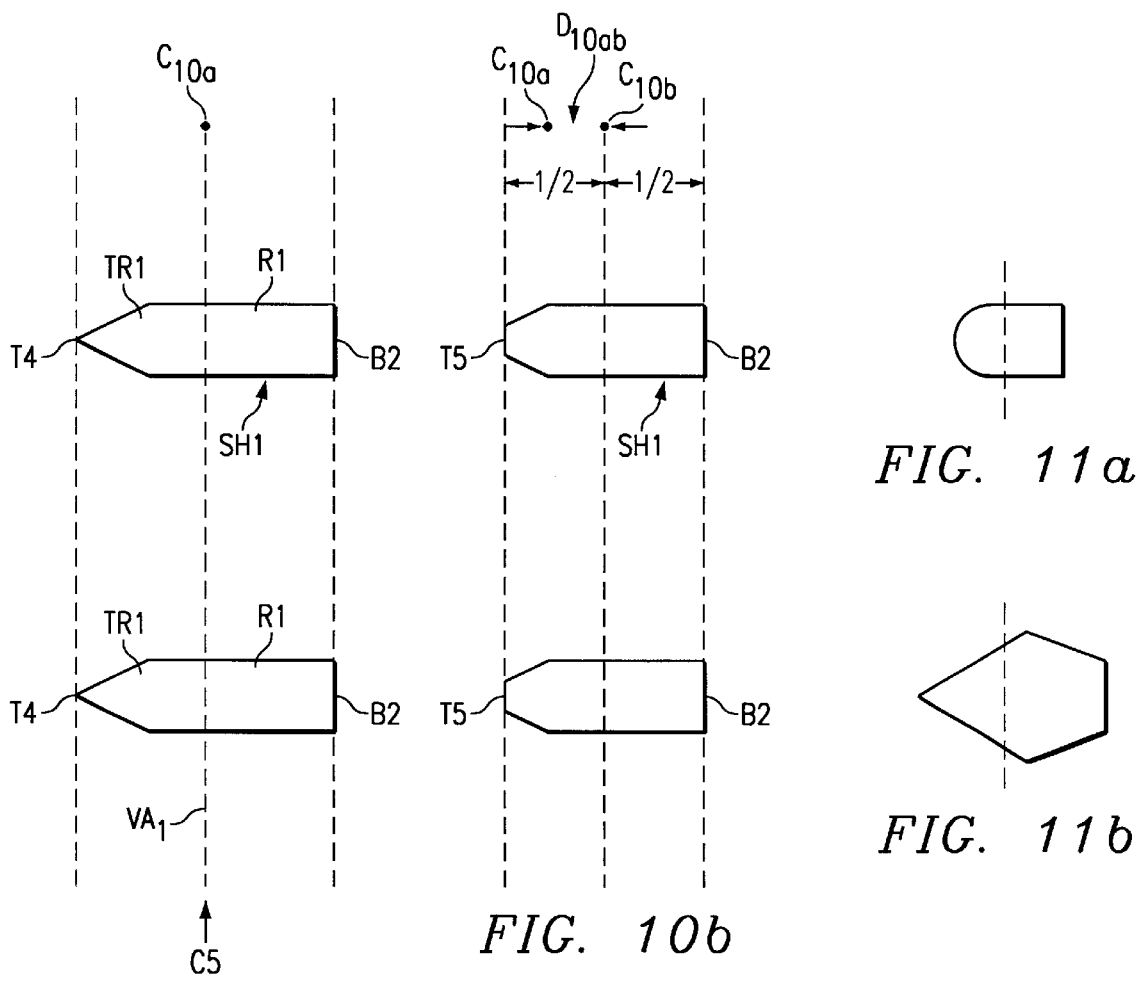
FIG. 10a
FIG. 10b
FIG. 11a
FIG. 11b

INTEGRATED CIRCUIT SYSTEM WITH AUTOMATED BEST FOCUS DETERMINATION BASED ON CHANGE IN ALIGNMENT DUE TO PREDICTABLE PATTERN DEGRADATION

CROSS-REFERENCES TO RELATED APPLICATIONS

This application claims priority under 35 USC §119(e)(1) of provisional application No. 60/167,274 filed Nov. 24, 1999.

STATEMENT REGARDING FEDERALLY SPONSORED RESEARCH OR DEVELOPMENT

Not Applicable.

BACKGROUND OF THE INVENTION

The present embodiments relate to fabricating semiconductor integrated circuits, and are more particularly directed to automatically determining the best focus for a wafer stepper for thereafter forming integrated circuits on semiconductor substrates.

Integrated circuits are immensely prevalent in all aspects of contemporary electronic technology. Indeed, vast resources are expended in developing and implementing integrated circuit technology in order to supply demands imposed by the consuming marketplace. In this regard, the efficient production of integrated circuits is critical, and the present embodiments are directed at such efficiency. Particularly, the present embodiments improve the efficiency for focusing a wafer stepper used to build integrated circuits on a semiconductor wafer or the like and, therefore, improve the entire process of integrated circuit formation. This as well as other benefits are explored later, but are first preceded by a discussion of the prior art.

By way of introduction, FIG. 1 illustrates a general view of various components of a patterning system 10, where system 10 is generally available in the prior art, but also may be improved using the best focus determination of the preferred embodiments discussed later. Before proceeding, note that system 10 is shown in a simplified format in that only various components are illustrated, or consolidated, in order to simplify the present discussion and to facilitate a greater understanding of the background of the preferred embodiments discussed later; thus, one skilled in the art will appreciate that system 10 may include various items in addition to, or in lieu of, those shown in FIG. 1. Turning then to the details of FIG. 1, system 10 includes a light source 12 disposed over a plate 14, where plate 14 is typically quartz and is or has been referred to in the art by various names such as a "reticle" or a "mask." For sake of convenience, therefore, plate 14 is hereafter referred to as reticle 14. Located below reticle 14 is a projection lens 16, which actually may include more than one lens and may cooperate with one or more mirrors (not shown). Looking to the bottom of FIG. 1, system 10 further includes a wafer support 18, which supports at least one wafer 20 so that its surface 20s is facing projection lens 16. A photoresist layer 22 may be placed on surface 20s. Lastly, system 10 includes a controller 29 which may include electronic control circuitry and apparatus, including computer control such as through a processor or the like, so that various control actions may be taken with respect to other items in system 10; by way of example, therefore, control arrows are shown from controller 29 to light source 12, reticle 14, projection lens 16, and wafer support 18.

A brief description of the operation of system 10 is now provided. Light source 12 is energized, such as by way of a control operation from controller 29, and in response it provides a light beam 24 to reticle 14. Although not expressly shown in FIG. 1, it is known in the art that portions of reticle 14 block the passage of light while other portions of reticle 14 allow light to pass through it, thereby providing a light image 26 toward projection lens 16. Projection lens 16 then focuses and projects light image 26 so that a projected image 28 is directed toward a particular location on photoresist layer 22 and corresponding to an underlying location of surface 20s of wafer 20. A particular location is sometimes referred to in the art as an exposure or field. Once projected image 28 impinges on surface 20s, and in combination with the effect of photoresist 22, a circuit image is formed, and it should be noted that this image may form directly on surface 20s or in some other layer that has been located on surface 20s (e.g., polysilicon, silicon dioxide, silicon nitride, glass, polyamide, metals or metal alloys). In any event, the circuit image includes either a circuit element or some other photographically imparted device features in surface 20s or a layer above that surface. Lastly, it is noted that this image is also sometimes referred to in the art as a pattern.

After the steps described above, wafer support 18 moves and thereby moves wafer 20, such as by way of a control operation from controller 29. Next, the steps described above are repeated, so once more light beam 24 passes through reticle 14 to produce a light image 26, and light image 26 passes through projection lens 16 to create a projected image 28 which impinges on a different location of photoresist layer 22 corresponding to a different underlying location on wafer 20. This repeated sequence is itself repeated numerous times so that numerous images (or patterns) are formed on a single wafer. Each image may be a portion of a single circuit or may represent multiple duplicate circuits on the wafer. Thus, system 10 essentially "steps" from one image to the next and, hence, is often referred to in the art as a "stepper."

Having now described system 10 in structure and its operation, attention is turned to issues of image beam focus, as that concept is particularly relevant to the preferred embodiments described later. In particular, since system 10 comprises photolithographic aspects, then the vertical displacement lens 16 and wafer 20 defines the extent to which projected image 28 is properly focused on wafer 20 (or photoresist 22). As with most photolithographic processes, the better the focus, the better the resultant product. Thus, controller 29 further includes some type of focus control apparatus for adjusting the focus of projected image 28 with respect to wafer 20, such as by vertically moving projection lens 16 relative to wafer 20. As a basis for the amount of movement required, typically a sample wafer is first selected form a batch (or "lot") of wafers, and the sample wafer is used to determine an appropriate focus distance referred to as a "best focus," where examples of this determination are detailed below. This best focus distance is then used for the remaining wafers in the batch as each of those wafers is patterned using system 10. More particularly, for each of those wafers, the earlier-determined best focus is used with respect to system 10 to adjust projection lens to relative to wafer 20. Indeed, most commonly a focus correction is made prior to each exposure in an effort to obtain an optimal focus for the ensuing exposure.

A first prior art method for determining a best focus is now introduced, and explained in greater detail below in connection with the graph of FIG. 2a. In this method, a sample wafer is placed either in a given stepper system or a comparable system that is assumed to have a same focusing distance as the given stepper system, where the comparable system will be used to pattern other wafers from the same batch as the sample wafer. Next, a number of lines are patterned on the sample wafer, where different lines are patterned using different focus distances. A first distance is considered a baseline value which is established at what is anticipated as the best focus distance but, as detailed below, the result of the method may indicate that some offset distance should be added or subtracted from the baseline value to achieve the best focus for either the given system in which the sample wafer is patterned or in another system which is expected to be sufficiently comparable to the given system.

Turning to FIG. 2a, it illustrates measurements that are made of the critical dimension ("CD") for the patterned lines formed on a sample wafer, where typically the CD is the width of the line and corresponding to the smallest width which will be required to form a part of a circuit element (e.g., a width of the gate of a transistor). The horizontal axis in FIG. 2a illustrates distance of focus (in microns), with a level of 0 set at what is introduced above as the baseline value (i.e., the initial value anticipated as the best focus distance for the stepper system). Thus, any distance away from the baseline level of 0 focus may be considered an extent of "defocus." The vertical dimension in FIG. 2a illustrates the CD of a line formed on the sample wafer for a given focus. The plot is defined by drawing lines between points plotted on the graph, where in the current example there are six points P1 through P6, each representing an example of a CD measurement as further detailed below.

Looking to some specific points in the plot, point P1 is the CD measurement for the line patterned on the sample wafer using the level 0 focus, where that line is measured to have a CD equal to 0.20 μm. Another point P2 is illustrated where the stepper is adjusted to a focus that is 0.2 μm in a first direction away from the level 0 focus and a line is formed on the wafer; this first direction may be considered positive relative to the level 0 focus and is shown in the plot at a defocus level of 0.2, and it corresponds to a CD measurement equal to 0.19 μm. In a second opposite direction away from the level 0 focus, a point P3 is illustrated where the stepper is adjusted to a focus that is 0.2 μm in a second direction away from the level 0 focus and a line is formed on the wafer; this second direction may be considered negative relative to the level 0 focus and is shown in the plot at a defocus level of −0.2, and it corresponds to a CD measurement equal to 0.21 μm. This process is repeated for a total of six points as shown, where the levels of focus and corresponding CD measurements for all six points are shown in the following Table 1:

TABLE 1

| Point | defocus | CD |
|---|---|---|
| P1 | 0 | 0.20 |
| P2 | 0.2 | 0.19 |
| P3 | −0.2 | 0.21 |
| P4 | −0.4 | 0.16 |
| P5 | 0.4 | 0.17 |
| P6 | 0.6 | 0.12 |

FIG. 2b illustrates the same plot of FIG. 2a, and adds a window W for defining the best focus point for a selected value of CD, where the sides of window W are defined to occur where the plot intersects the selected value of CD. For example, FIG. 2b illustrates window W defined for a CD equal to 0.17 μm and, thus, a dashed horizontal line is drawn at CD equal to 0.17 μm. The right bound of window W occurs at P5 and, thus, occurs for a value of focus equal to 0.4. The left bound of window W occurs between P4 and P3; the value of focus at this intersection point therefore may be derived based by defining an equation representing the line between P4 and P3. Table 1 demonstrates that the slope between P4 and P3 equals 2.5. Accordingly, the equation of the line between P4 and P3 is shown in the following Equation 1:

$$CD=[(\text{slope})*(\text{focus}-\text{focus at }P4)]+(CD\text{ at }P4)=[(2.5)*(\text{focus}+0.4)]+0.16 \qquad \text{Equation 1}$$

Equation 1 may be re-arranged to solve for the focus value between P4 and P3 and for CD equal to 0.17, as shown in the following Equation 2:

$$\text{focus}=[0.17-0.16]/2.5-0.4=0.04-0.4=-0.36 \qquad \text{Equation 2}$$

Thus, Equation 2 demonstrates that the left bound of window W occurs for a value of focus equal to −0.36.

Once the right and left bounds of window W are determined, the first prior art approach then examines the center point between those bounds and uses that center point as the best focus. In the current example, recall that that the right bound of window W occurs at a focus level equal to 0.4 and the left bound of window W occurs at a focus level of −0.36. Thus, the center point between these bounds occurs at a focus value equal to 0.02. Accordingly, while the initial assumption was that the baseline level of 0 is the best focus distance for the given stepper system, the center point of the plot suggests instead that the best focus occurs at a positive distance 0.02 μm from the level of 0. As a result, an offset value of 0.02 μm relative to the baseline position is used to adjust the stepper focus for patterning the remaining wafers in the batch using that stepper.

While the first prior art method described above (or variants thereof) has proven effective in various circumstances, it also has drawbacks. For example, the method is considerably time consuming given the requirements repeated CD measurements. Moreover, using the center point of a plot is based on various assumptions regarding the curvature of the plot and, for a given wafer or system such assumptions may be questionable. Still further, the accuracy of the best focus determination is on the order of 0.1 μm, which may be unacceptable for smaller CD implementations or based on other considerations.

A second prior art method for determining a best focus is now described and illustrated in part with reference to FIG. 3. In this method, once more a sample wafer is placed either in a given stepper system or a comparable system that is assumed to have a same focusing distance as the given stepper system, where such a system will be used to pattern other wafers from the same batch as the sample wafer. Here, a pattern is formed on the wafer as detailed below, and as now introduced using FIG. 3. Specifically, FIG. 3 shows a wafer 24 subdivided into many regions or frames as is known in the art, where each frame under normal fabrication represents an area where a circuit or duplicate circuits are formed during a single exposure. To the right of FIG. 3 a singe frame $24_{F1}$ is enlarged to further demonstrate the second prior art method for determining a best focus.

Looking to frame $24_{F1}$ in greater detail, the second prior art method for determining best focus uses a stepper to pattern a set of identically-shaped elements on from $24_{F1}$, where the elements are typically square in shape and are referred to in the art as "dots"; accordingly, the designation D is used in FIG. 3 to identify various ones of the dots by way of example. Typically, each of dots D is on the order of 0.3 to 0.5 μm in length and width. Thus, a first set of dots D are patterned on from $24_{F1}$ using the stepper at a baseline focus level. Although not shown in FIG. 3, numerous other sets of dots D are also patterned on other frames of wafer 24, where each different set is formed using different focus level. By way of example assume that the new focus level for a first group of sets other than the baseline set are formed at increments of 0.2 μm in a first direction away from the baseline focus level (e.g., at +0.2 μm, +0.4 μm, +0.6 μm and so forth relative to the baseline level). Assume further that the new focus level for a second group of sets other than the baseline set are formed at increments of 0.2 μm in a second and opposite direction away form the baseline focus level (e.g., at −0.2 μm, −0.4 μm, −0.6 μm and so forth relative to the baseline level).

Once one or more sets of dots D are formed under the second prior art method, wafer 24 is analyzed manually by a person using a microscope where the person confirms that dots D were printed on wafer 24 according to the baseline level. Next, the person views, using the microscope, the sets of dots other than the baseline set and which were formed using the focus levels in the first direction. At some point while viewing the different sets of dots formed using the focus levels in the first direction, and due to the increase in the focus levels, dots D for a particular set are will no longer be viewable under the microscope. This point is referred to in the art as the point when dots D disappear. For this reason, this second method is also sometimes referred to in the art as a "disappearing dots" technique. In any event, the person records the stepper focus in the first direction corresponding to the set of dots D which disappeared under the microscope. Next, the person views, using the microscope, the sets of dots other than the baseline set and which were formed using the focus levels in the second direction. Once more, at some point while viewing the dots formed using the focus levels in the second direction dots D in a particular set will no longer be viewable under the microscope (i.e., they are said to disappear). When this point is detected, the person records the stepper focus in the second direction corresponding to the set of dots D which disappeared under the microscope. Given the two focus levels corresponding to disappearing dots in both the first direction of focus and the second direction of focus, the center point between those points is defined as the best focus for the stepper. As with the first prior art method, this best focus is then used as an offset to adjust the baseline focus of the stepper such as the stepper of system 10 in FIG. 1.

While the second prior art method described above (or variants thereof) also has proven effective in various circumstances, it too has drawbacks. For example, the method also is time consuming. As another example, the determination of when dots D disappear is subjective in the analysis of the person operating the microscope, and is also subject to human error. Most likely for these reasons, the accuracy of the best focus determination is on the order of 0.2 μm, which may not be acceptable for certain integrated circuit implementations.

A third prior art method for determining a best focus is sometimes referred to in the art as an equal line space grating technique, and is now described and illustrated in part with reference to FIGS. 4a through 4d, where for simplicity each of these Figures shows a single corresponding frame of a wafer 26. Like the second method described above, this third method also prints test patterns on wafer 26 and those patterns are each manually examined using a microscope. However, the patterns are formed using a different technique and the examination is typically not fully to the level of a completely disappearing pattern. Turning first to the patterns, FIG. 4a illustrates a frame $26_{F1}$ where a pattern of symmetric elements is formed along a first line L1. Although not shown, each element E actually consists of a number of parallel thinner lines, where these lines are along the same dimension as line L1 (i.e., horizontal in the example of FIG. 4a). All elements E of line L1 are formed at a first baseline exposure level, but the focus level is increased from left to right along line L1. In addition to the formation of line L1, the stepper is moved to a greater exposure level, and a line L2 of elements is formed on a different frame $26_{F2}$ as shown in FIG. 4b, where again the focus level is increased from left to right along the line (i.e., L2 in this case). This process is typically repeated for numerous different lines of elements, where lines of elements are formed for exposure levels increasing from the baseline exposure level, and also for exposure levels decreasing from the baseline exposure level. By way of example, therefore, two additional frames $26_{F3}$ and $26_{F4}$ are shown in FIGS. 4c and 4d, respectively.

Once a number of different lines are formed, wafer 26 is analyzed manually by a person using a microscope where the person confirms they see a number of elements E in the case of the baseline focus, which recall is shown in line L1; thus, for the example of FIG. 4a, the person would confirm seeing a total of five elements. However, as to the additional lines, the number of visible elements will begin to decrease at some point in the direction of increasing exposure from the baseline exposure level and in the direction of decreasing exposure from the baseline exposure level. Thus, by way of example, FIGS. 4b through 4d illustrate an example of the view of lines in increasing exposure, while one skilled in the art will readily appreciate that a comparable result will occur for the lines of decreasing exposure. Looking then to FIG. 4b, only four elements are shown (i.e., are visible under the microscope) while it also should be appreciated that the change in number of elements may actually occur only after additional lines are formed. In any event, the above process of viewing the different lines is repeated until the number of visible elements reaches a predetermined and typically relatively small number (e.g., two). Thus, by way of example, FIGS. 4c and 4d illustrate lines L3 and L4, respectively, with it understood that line L3 is formed at a greater exposure than line L2, and line L4 is formed at a greater exposure than line L3. Moreover, the illustration is intended to depict the view of these lines under the microscope and, hence, note that fewer elements are visible when line L3 is examined, and still fewer are visible when line L4 is examined. When line L4 is examined and it is revealed that only two elements are visible, then the focus level of the right and left element are used as bounds, and the midpoint between those two focus levels is recorded. Similarly, although not shown in additional Figures, recall that lines are also formed on wafer 26 in decreasing levels of exposure from the baseline; thus, these lines are also microscopically examined until a line is found with the same relatively small number of elements used to constrain the focus level for the lines formed using increasing exposures. Once this additional line is identified, then again the focus levels of its right and left element are used as bounds, and the midpoint between those two focus levels is recorded. Given the two midpoints corresponding to the reduced number of elements in both the first direction of exposure and the second direction of exposure, the halfway point between those midpoints is defined as the best focus for the stepper and, therefore, is used to adjust the baseline of the stepper according to that best focus.

The third prior art method described above is also effective to a certain extent, but shares the same drawbacks as the second prior art method. For example, the method is time consuming. As another example, the determination is visual and, hence, subjective and subject to human error. In addition, the accuracy of the best focus determination is on the order of 0.2 $\mu$m, which again may not be acceptable for certain implementations.

A fourth prior art method for determining a best focus is sometimes referred to in the art as a phase shifted reticle technique, and is now described and illustrated in part with reference to FIGS. 5a through 5d. This method also uses test patterns on a sample wafer, and here the wafer is labeled wafer 28 for purposes of reference. In this case, wafer 28 (or photoresist on wafer 28) is exposed to an element of light as well as a ninety degree phase shifted component of the light element. For example, and as shown in FIG. 5a, the light and its phase shifted element are directed to a first frame $28_{F1}$ of wafer 28 at a first focus level, thereby forming a main component $M_1$ and a phase shifted element $PSE_1$. Further, this exposure technique is repeated for additional focus levels as shown in FIGS. 5b through 5d and for different fields $28_{F2}$ through $28_{F4}$, respectively. For each repeated exposure, a different focus level is used which once more forms a main component $M_2$ though $M_4$, respectively, and a corresponding phase shifted element $PSE_2$ through $PSE_4$, respectively.

The fourth prior art method for determining a best focus value also makes a determination for each patterned field. In this case, a distance is determined between each main component and its corresponding phase shifted element More particularly, in the current art, a metrology tool is used, where such a tool is known in the integrated circuit layout art for purposes of ensuring proper overlay as further detailed later. At this point, note that a metrology tool provides an automated system for determining a center point of one or more patterns on a wafer, and also for measuring a distance between detected center points. For the sake of illustration, these center points are shown in FIGS. 5a through 5d; for example, in FIG. 5a, main component $M_1$ has a center point $CM_1$, and phase shifted element $PSE_1$ has a center point $CPSE_1$. With respect to these center points, it should be understood that they are shown in the illustration based on the symmetric nature of the patterns where the metrology tool should identify a center point, while in actuality no physical indication of the center point is visible on the pattern. Once the center points are identified for a given field, the metrology tool also measures the distance between those center points. These steps of identifying center points and measuring the distance between them is repeated for all fields $28_{F1}$ through $28_{F4}$. Thereafter, the distances are compared, and the focus used to form the pattern on the field having the shortest distance between a main component and its corresponding phase shifted element is determined to correspond to the best focus. In the example of FIGS. 5a through 5d, therefore, field $28_{F3}$ of FIG. 5c depicts the shortest distance between its main component and its corresponding phase shifted element. Accordingly, the focus level used to form main element $M_3$ of field $28_{F3}$ is accepted as the best focus for the system.

The fourth prior art method described above provides some advantage over the other prior art approaches, but it too suffers some drawbacks. As one primary example, the fourth prior art method is only useful for certain exposure conditions. More particularly, the fourth prior art method is only applicable to so-called small sigma applications. In other words, it is known in the art that when two light beams come together there is resulting coherence and interference. Typically, for a small aperture, which corresponds to a small sigma, there is larger coherence and larger interference; conversely, for a larger aperture (i.e., large sigma), there is smaller coherence and smaller interference. Given these concepts, this fourth prior art method described above is only usable in the small sigma situation and, thus, does not provide a technique for large sigma applications.

Each of the above prior art techniques is implemented to ultimately generate multiple integrated circuits on a single wafer, and with the goal of doing so at an acceptably accurate level of focus. However, when focus is poor the resulting integrated circuits may be unusable or unstable devices and, thus, attention to focus issues is important for operability and production efficiency. Further, as integrated circuit device features continues to decrease in size, and as semiconductor product volume increases, there is a strong need to determine and maintain the best focus of a stepper such as system 10 and to characterize lens performance with high accuracy. Thus, while the prior art attempts to optimize focus, there are various drawbacks as set forth above, and the preferred embodiments endeavor to achieve improved or optimal focus and thereby to reduce or eliminate such drawbacks, as further discussed in detail below.

BRIEF SUMMARY OF THE INVENTION

In the preferred embodiment, there is a method of determining a best focus for an integrated circuit stepper. The method repeats various steps for a plurality of different focus levels. The repeated steps include forming a first element group on a wafer, where the first element group comprises one or more elements and each of the one or more elements in the first element group has a shape. The repeated steps further include defining a first reference point for the first element group at a position relative to the shape of the one or more elements in the first element group. Similarly, the repeated steps include forming a second element group on the wafer, where the second group comprises one or more elements and each of the one or more elements in the second element group has a shape, and defining a second reference point for the second element group at a position relative to the shape of the one or more elements in the second element group. Still another repeated step is measuring a distance between the first reference point and the second reference point such that a distance measurement is identified for each of the plurality of different focus levels. Finally, the method selects as the best focus a focus level from the plurality of different focus levels and corresponding to a selected one of the distance measurements. Other apparatus, systems, and methods are also disclosed and claimed.

BRIEF DESCRIPTION OF THE SEVERAL VIEWS OF THE DRAWING

FIG. 7b illustrates the prior art square pattern of FIG. 7a and an additional prior art square pattern formed within the pattern from FIG. 7a;

FIG. 8 illustrates an inventive method of operating a metrology tool with respect to the inventive patterns illustrated in FIGS. 6a through 6d;

FIG. 10a illustrates an alternative pattern within the present inventive scope and having one pointed end and a non-pointed end for degrading in a predictable manner in response to being patterned at different focus levels;

FIG. 10b illustrates the pattern of FIG. 10a after being patterned using a different focus level and with a certain extent of pattern degradation;

FIG. 11a illustrates an alternative pattern within the present inventive scope and having one end which degrades faster than its other end for degrading in a predictable manner in response to being patterned at different focus levels; and FIG. 11b illustrates another alternative pattern within the present inventive scope and having one end which degrades faster than its other end for degrading in a predictable manner in response to being patterned at different focus levels.

DETAILED DESCRIPTION OF THE INVENTION

FIGS. 1 through 5d were discussed in the earlier Background Of The Invention section of this document, and the reader is assumed familiar with the details surrounding those Figures.

Figure 1:
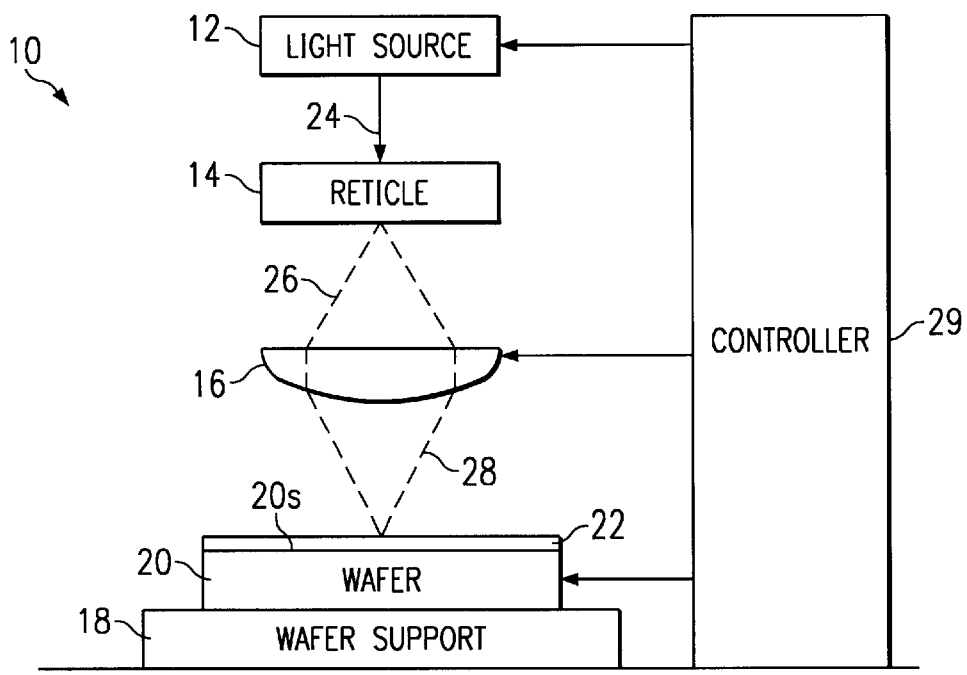
FIG. 1 illustrates a view of a stepper system for patterning a semiconductor wafer, and which may be used and focused according to the preferred embodiment.
Figure 2A:
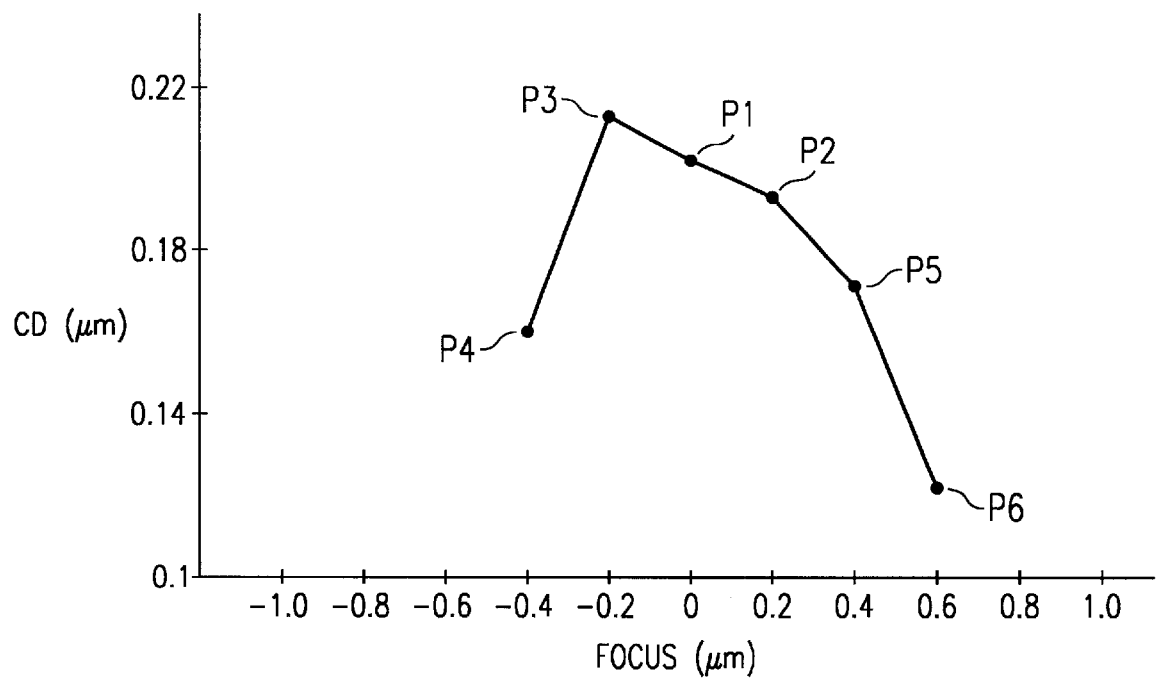
FIG. 2a illustrates a prior art plot of critical dimension measurements for respective patterns formed on a semiconductor wafer at different focus levels.
Figure 2B:
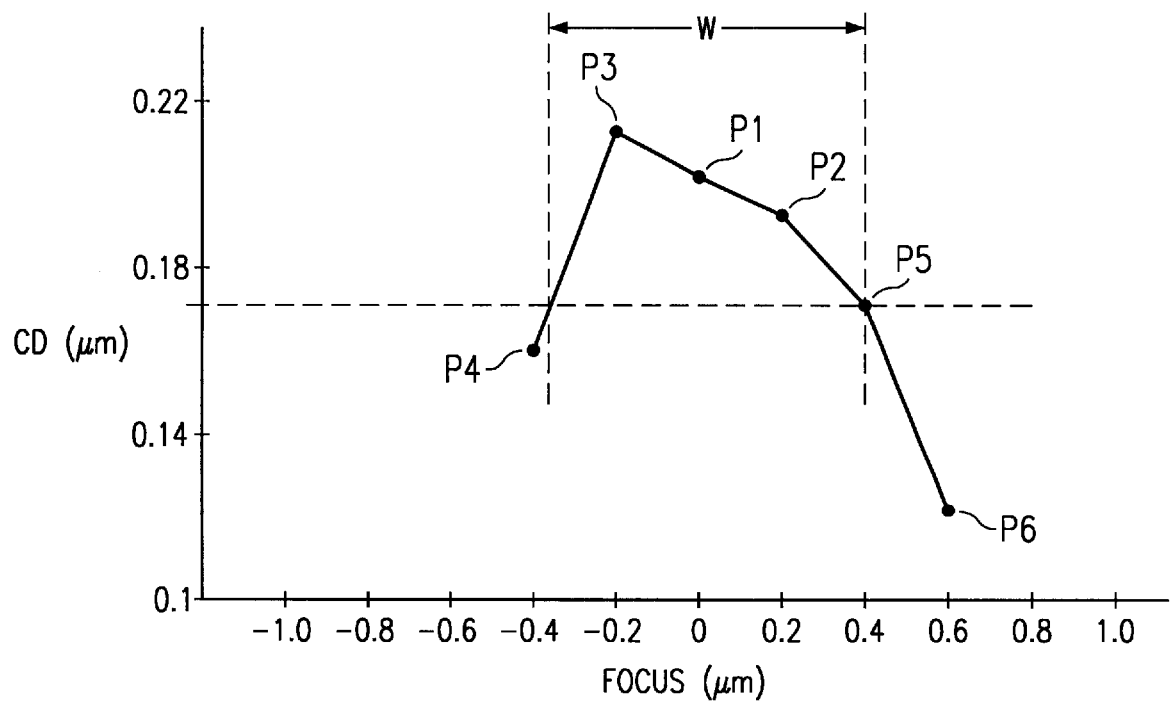
FIG. 2b illustrates the prior art plot of FIG. 2a with a process window defined on the plot for a device having a critical dimension equal to 0.17 $\mu$m.
Figure 3:
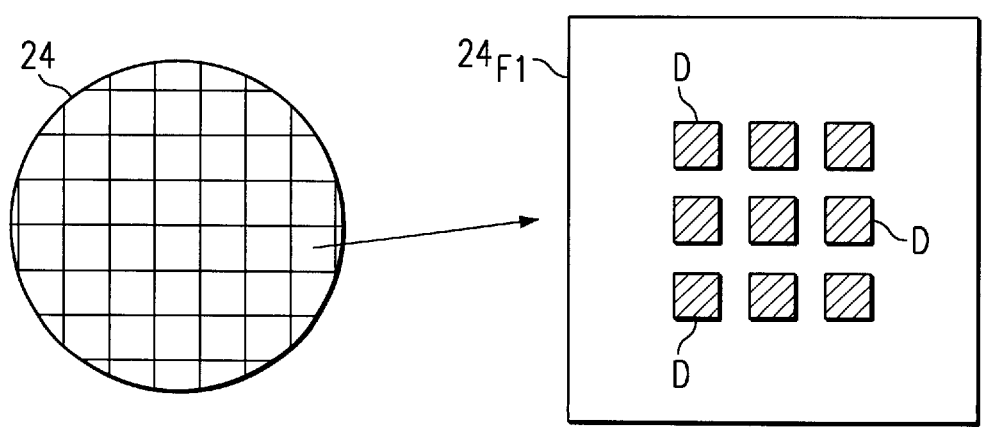
FIG. 3 illustrates a semiconductor wafer and a prior art dot pattern formed on a frame of that wafer, where the dot pattern is formed on numerous additional frames on the wafer where each additional frame is patterned at a different focus level.
Figure 4A:
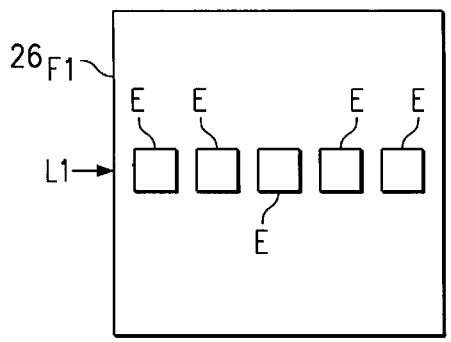
FIG. 4a illustrates a prior art equal line space grating pattern formed on a wafer frame at a first exposure level.
Figure 4B:
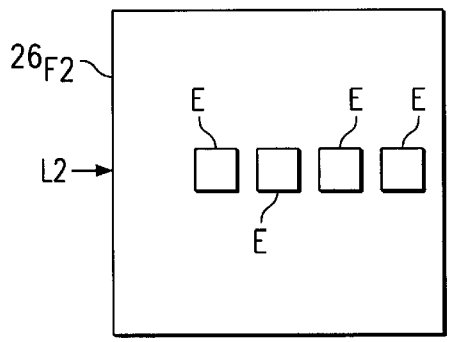
FIG. 4b illustrates a prior art equal line space grating pattern formed on a wafer frame at a second exposure level.
Figure 4C:
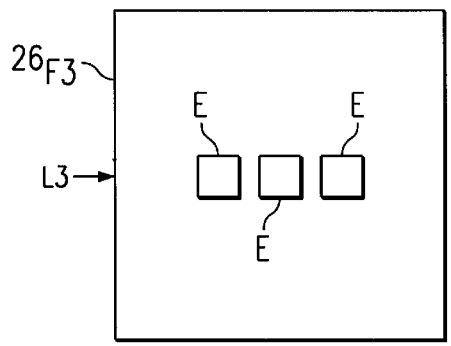
FIG. 4c illustrates a prior art equal line space grating pattern formed on a wafer frame at a third exposure level.
Figure 4D:
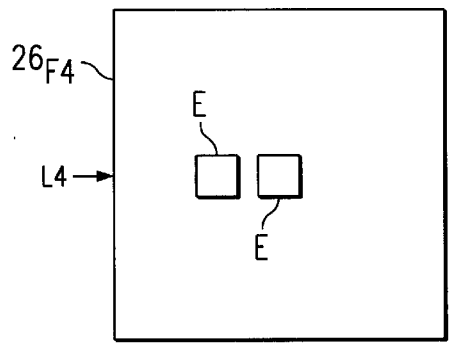
FIG. 4d illustrates a prior art equal line space grating pattern formed on a wafer frame at a fourth exposure level.
Figure 5A:
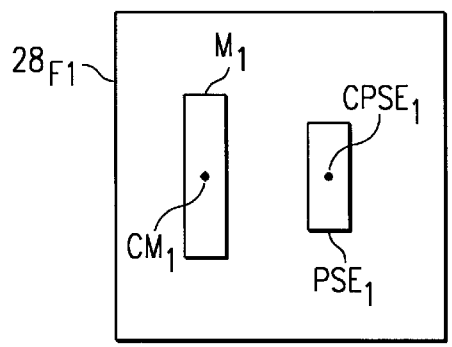
FIG. 5a illustrates a prior art main component light element and its ninety degree phase shifted element exposed to a wafer frame at a first focus level.
Figure 5B:
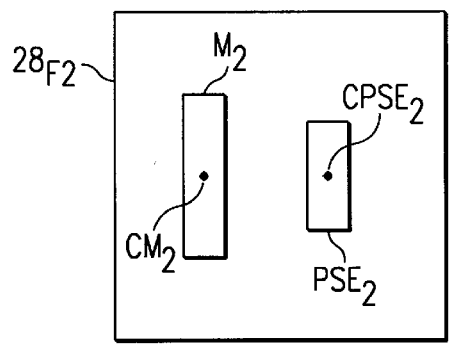
FIG. 5b illustrates a prior art main component light element and its ninety degree phase shifted element exposed to a wafer from at a second focus level.
Figure 5C:
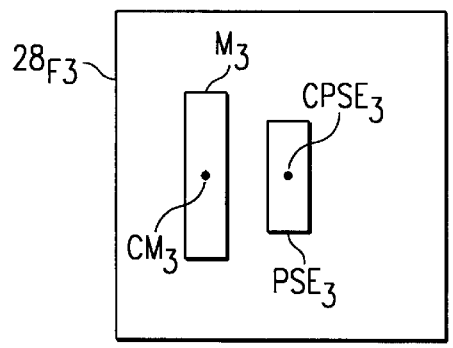
FIG. 5c illustrates a prior art main component light element and its ninety degree phase shifted element exposed to a wafer frame at a third focus level.
Figure 5D:
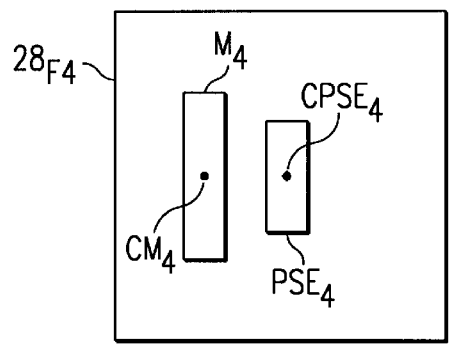
FIG. 5d illustrates a prior art main component light element and its ninety degree phase shifted element exposed to a wafer frame art a fourth focus level.
Figure 6A:
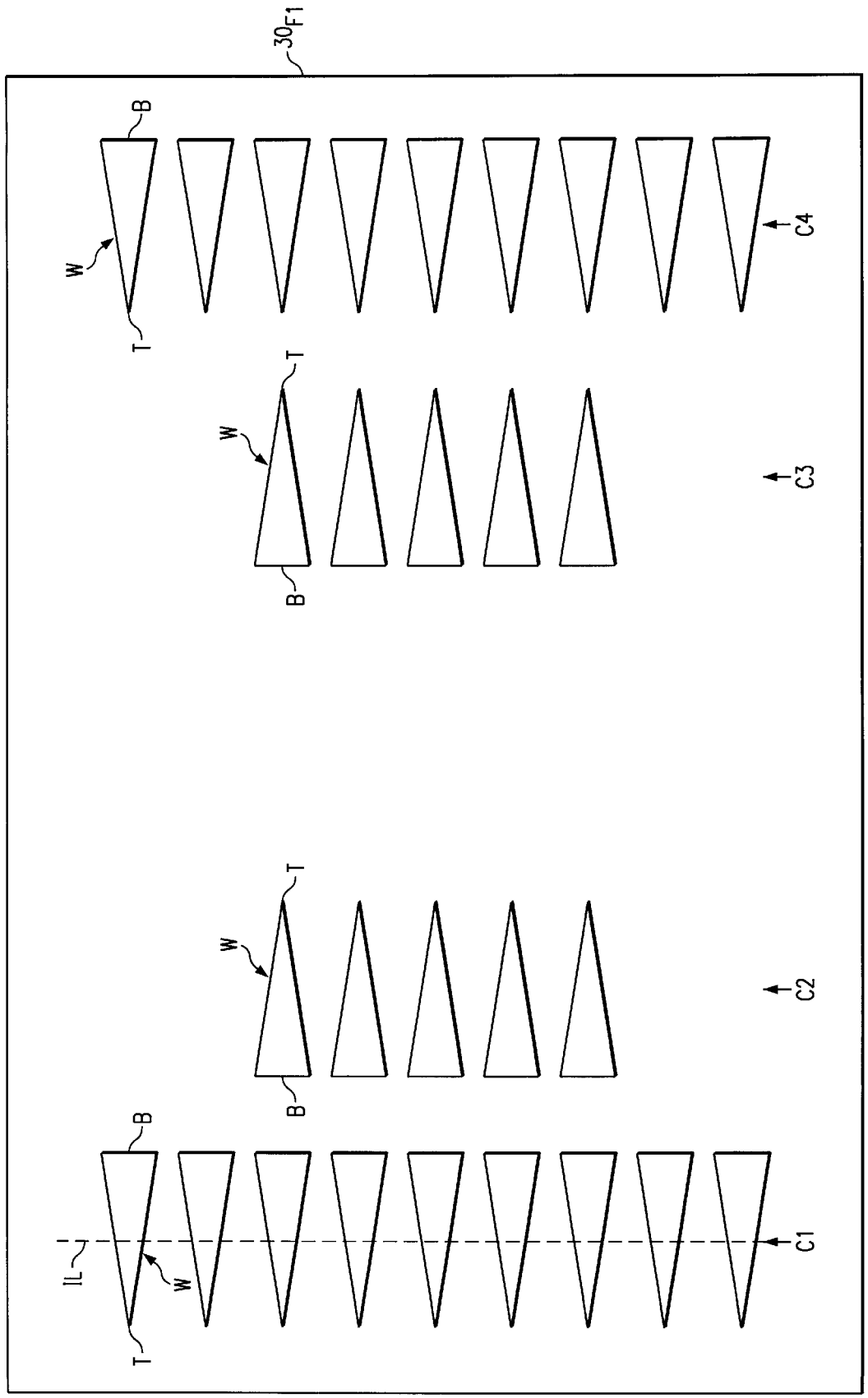
FIG. 6a illustrates a first inventive embodiment of a pattern formed on a wafer of a semiconductor wafer at a first focus level, where the pattern includes wedges formed along columns where the wedges in a first pair of the columns point in a first direction and the wedges in a second pair of the columns point in a second direction opposite the first direction.

FIG. 6a illustrates a frame $30_{F1}$ which is part of a sample wafer 30 that may be located in the position of wafer 20 in system 10 shown in FIG. 1, or in other systems that will benefit from a best focus determination and adjustment. Turning to frame $30_{F1}$, a preferred inventive pattern is shown formed on the frame, where the pattern is detailed in this document and it will be known to one skilled in the art that the pattern may be achieved by various techniques such as through use of an appropriate reticle such as reticle 14 in FIG. 1. The preferred pattern of frame $30_{F1}$ includes a number of elements is all having the same shape, where these elements are referred to in this document by way of convenience as wedges W and only a few are labeled in FIG. 6a (and later Figures) to simplify the illustration. Note that the term wedge is chosen due to the wedge shape of the elements and is not intended as a limitation on the inventive scope. Indeed, as discussed later, numerous alternative shapes may be used given the present inventive teachings. In the preferred embodiment, each of the wedges on frame $30_{F1}$ is formed in a single exposure and using a stepper, such as in system 10 of FIG. 1, at a first focus level. Further in this regard and as explained later, note that the term "first focus" for patterning frame $30_{F1}$ of FIG. 6a is only for sake of later corresponding a given focus level to frame $30_{F1}$. Thus, the term first focus is not intended to suggest that other frames could not be patterned earlier and, indeed, as detailed below, in the preferred embodiment numerous frames are patterned using different focus levels and those frames may be formed before or after the patterning of frame $30_{F1}$.

Looking to a specific wedge W, it includes a base B and a tip T. In the preferred embodiment, each wedge is an isosceles triangle and the distance between a base B and a tip T is on the order of 4.0 μm, while base B is on the order of 0.3 to 0.5 μm long, although these numbers are by way of example and various other dimensions may be selected by one skilled in the art Further in the preferred embodiment, different groups of wedges are formed along lines referred to here as columns; for example, a first column C1 is formed in a direction shown vertically in FIG. 6a and includes nine wedges. As another example, a second column C2 is also formed in the vertical direction and includes five wedges. Similarly, columns C3 and C4 are also formed in the vertical direction and include five wedges and nine wedges, respectively. Given the orientation of the columns and the shape of each wedge, two further observations are now made for purposes of further elaboration later. As a first observation, the shape of each wedge includes only one pointed portion and that portion points in a direction that is perpendicular relative to the directionality of its group. For example, in FIG. 6a each group of wedges is vertical, and to illustrate this orientation an imaginary line IL is drawn vertically through the wedges of column C1; further, note that each wedge in column C1 is asymmetric relative to imaginary line IL. As a second observation, note that the direction in which the wedges point differs for pairs of columns. Thus, the wedges in one pair of columns, namely, columns C1 and C4 point to the left in FIG. 6a, while the wedges in another pair of columns, namely, columns C2 and C3 point to the right in FIG. 6a. These aspects are better appreciated at the conclusion of the remaining discussion of FIGS. 6b through 6d.

Figure 6B:
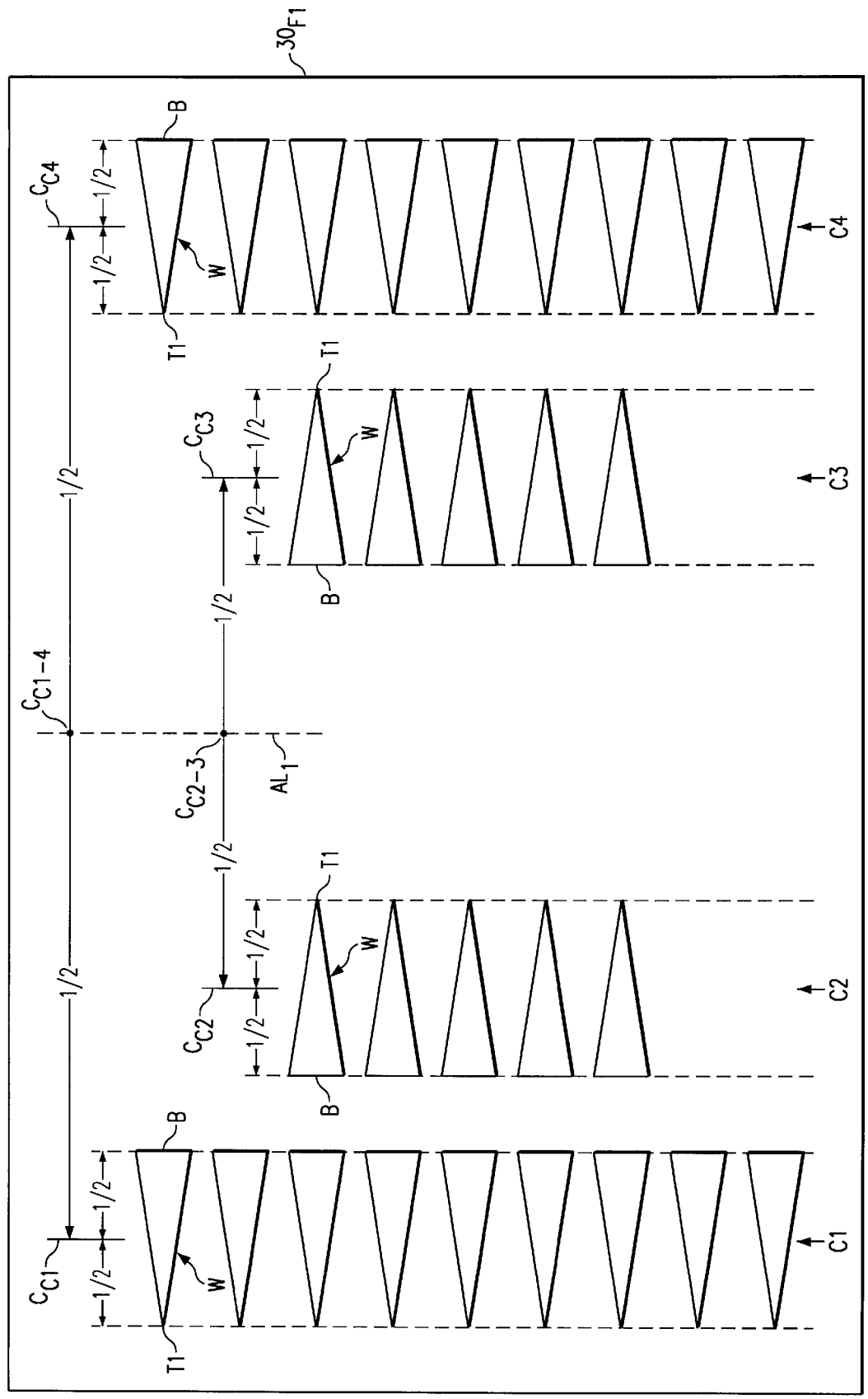
FIG. 6b illustrates the first inventive embodiment of FIG. 6a and defines various midpoints and center points associated with the wedge pattern.

FIG. 6b once more illustrates frame $30_{F1}$ of FIG. 6a, but adds some additional orientation and distance indications to further demonstrate the inventive scope; at the outset, it should be noted that the additional indications of FIG. 6b are simply to demonstrate the preferred embodiment and are not actual physical items visible on frame $30_{F1}$. Turning then to FIG. 6b, the alignment of each group of wedges is shown using dashed lines across the tips of all wedges in a group and across the bases of all wedges in a group. These dashed lines further define the location of the midpoint for each column of wedges, where the midpoint is defined as half the distance between the dashed lines corresponding to a particular column. For example, looking to column C1, a midpoint $C_{C1}$ occurs halfway between the two dashed lines associated with column C1. As another example, looking to column C2, a midpoint $C_{C2}$ occurs halfway between the two dashed lines associated with column C2. From these definitions, one skilled in the art also will appreciate the locations of the midpoint $C_{C1}$ corresponding to column C3 and the midpoint $C_{C4}$ corresponding to column C4.

The midpoints introduced above are relevant to the present inventive scope because, at some point after the pattern is formed on frame $30_{F1}$, the wafer 30 including pattern $30_{F1}$ is evaluated using a metrology tool, such as one which is commercially available from KLA. As detailed later, however, the method of operating the tool is significantly different than its prior art use. To further illustrate this aspect, the discussion now temporarily leaves FIGS. 6a and 6b, and turns to FIGS. 7a and 7b to demonstrate the prior use of a metrology tool in the very different art of integrated circuit alignment.

Figure 7A:
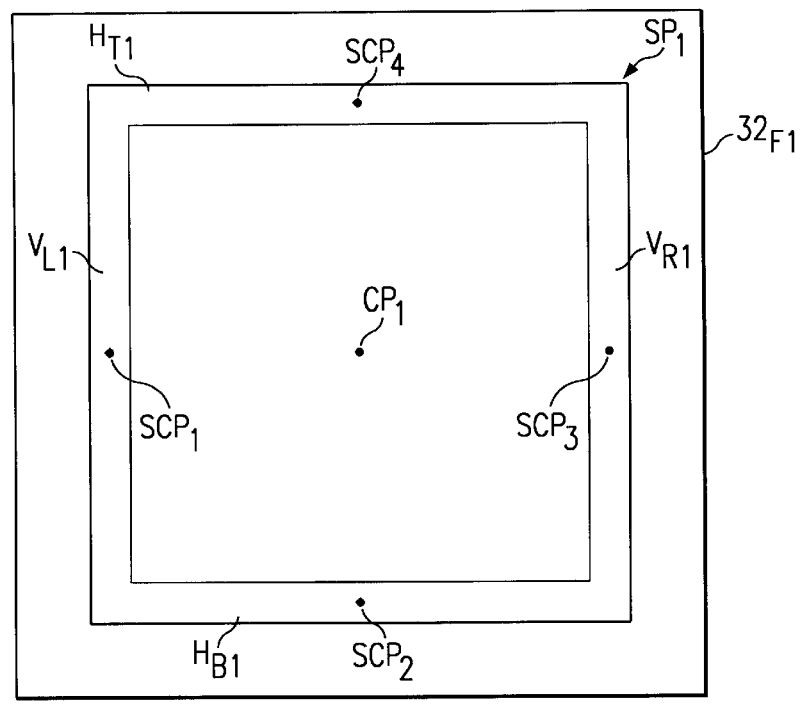
FIG. 7a illustrates a prior art square pattern on a semiconductor wafer for purposes of demonstrating the prior art use of a metrology tool for purposes of aligning circuitry within the square pattern.
Figure 7B:
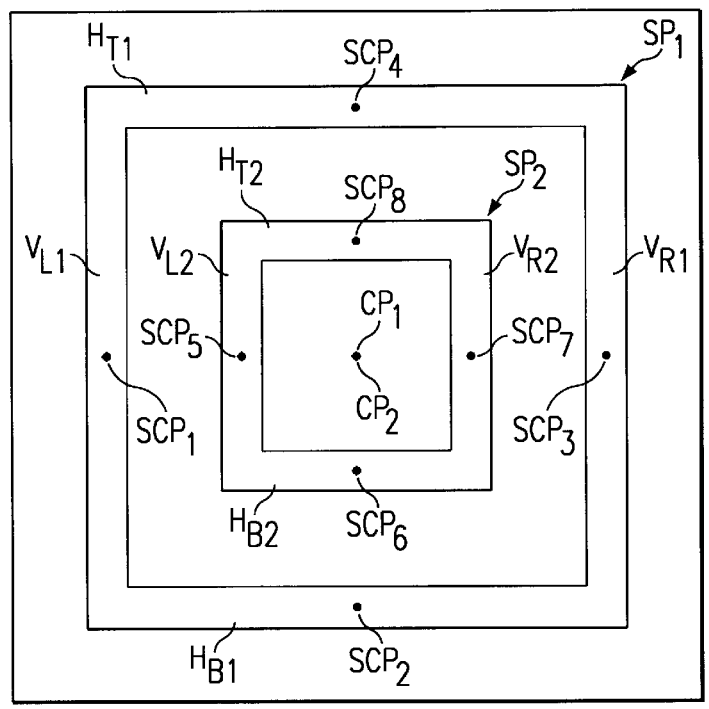

FIGS. 7a and 7b illustrate a frame $32_{F1}$ which is formed on a wafer 32 (not shown in its entirety) according to a prior art technique for aligning integrated circuit patterns. Turning first to FIG. 7a, a first square pattern $SP_1$ is formed on frame $32_{F1}$, where the purpose of square pattern $SP_1$ is to align any additional circuitry patterned within the pattern (although, for convenience sake, no such additional circuitry is shown in FIG. 7a). For purposes of reference, each of the four sides of pattern $SP_1$ are further labeled in FIG. 7a, including the vertical left side $V_{L1}$, the vertical right side $V_{R1}$, the horizontal top side $H_{T1}$, and the horizontal bottom side $H_{B1}$. Once pattern $SF_1$ is formed, a prior art metrology tool is capable of identifying the vertical and horizontal sides of square pattern $SP_1$. Given this identification and the symmetric nature of the sides of the square pattern, the metrology tool identifies the center point within each side and, thus, by way of illustration, four such side center points are shown $SCP_1$ through $SCP_4$. Further, given these side center points, the metrology tool is further operable to identify the center point $CP_1$ for square pattern $SP_1$. Lastly in this regard, note that the metrology tool actually determines a center point in each dimension (i.e., both horizontally with respect to sides $V_{L1}$ and $V_{R1}$ and vertically with respect to sides $H_{T1}$ and $H_{B1}$); however, assuring that pattern $SP_1$ is a square, these center points will be at the same location and, thus, only a single center point $CP_1$ is shown and discussed.

Turning to FIG. 7b, it again illustrates frame $32_{F1}$, and here a second square pattern $SP_2$ has been formed in addition to pattern $SP_1$. The sides of second square pattern $SP_2$ are also identifiable to the metrology tool, and these sides are shown in FIG. 7b as vertical left side $V_{L2}$, vertical right side $V_{R2}$, horizontal top side $H_{T2}$, and horizontal bottom side $H_{B2}$. Given these sides, the metrology tool identifies the center point within each side and, thus, four such side center points are shown $SCP_5$ through $SCP_8$. Lastly, given these side center points, the metrology tool is further operable to identify the center point $CP_2$ for square pattern $SP_2$.

Concluding the discussion of the operation of the metrology tool, note that FIG. 7b illustrates both patterns after they are formed on a given wafer. However, it is now noted that the metrology tool makes adjustments, if necessary, so that patterns $SP_1$ and $SP_2$ are ultimately aligned as shown in FIG. 7b, that is, center point $CP_2$ for square pattern $SP_2$ is aligned at the same location as center point $CP_1$ for square pattern $SP_1$. This alignment is achieved by the metrology tool given its capability of locating center points. More particularly, the metrology tool is capable of identifying center point $CP_2$ for square pattern $SP_2$ before square pattern $SP_2$ is actually patterned on to the wafer; once center point $CP_2$ is identified, the metrology tool makes adjustments, if necessary, so that center point $CP_2$ aligns with center point $CP_1$ at the time square pattern $SP_2$ is formed. Accordingly, since square pattern $SP_2$ aligns correctly with respect to square pattern $SP_1$, then any additional circuitry (not shown) patterned along with and within the sides of pattern $SP_2$ is accurately aligned with any circuitry that was previously patterned at the same time as pattern $SP_1$.

Returning now to FIG. 6b of the preferred embodiment, the use of a metrology tool in a manner other than the prior art is now appreciated in greater detail. Specifically, recall in the earlier introduction of FIG. 6b that dashed lines illustrate the alignment of each group of wedges and further define the expected location for midpoints which are half the distance between the dashed lines. Given the preceding discussion of a metrology tool, the preferred embodiment uses such a tool for determining the location of the midpoints $C_{C1}$, $C_{C2}$, $C_{C3}$, and $C_{C4}$, although as shown later this determination is not for purposes of alignment as in the prior art. Looking briefly now at the midpoint location aspect, the dashed lines on FIG. 6b represent boundaries which, like the sides of the square patterns in FIGS. 7a and 7b, are identifiable by the metrology tool; given those boundaries, the metrology tool can determine the location of midpoints $C_{C1}$, $C_{C2}$, $C_{C3}$, and $C_{C4}$ between those boundaries. Further, recall in the alignment prior art that the metrology tool is operable to locate the center points between sides of a square for purposes of alignment; in the preferred embodiment, however, and for reasons more apparent below, the metrology tool is instead used to identify the center point between columns having wedges oriented in the same dimension. For example, columns C1 and C4 have wedges oriented with their tips pointing to the left and, thus, the metrology tool, based on midpoints $C_{C1}$ and $C_{C4}$, is able to identify a center point $C_{C1-4}$ located halfway between these midpoints. Similarly, columns C2 and C3 have wedges oriented with their tips pointing to the right and, thus, the metrology tool, based on midpoints $C_{C2}$ and $C_{C3}$, is able to identify a center point $C_{C2-3}$ located halfway between these midpoints. Lastly, and for purpose of later discussion, note for the example illustration of FIG. 6b that center point $C_{C1-4}$ corresponding to columns C1 and C4 is vertically aligned with center point $C_{C2-3}$ corresponding to columns C2 and C3, as further illustrated by a vertical dashed alignment line $AL_1$.

Recalling that the wedges on frame $30_{F1}$ are formed at a first focus level, in the preferred embodiment additional frames on the same wafer 30 are patterned with the same orientation and number of wedges, although for each different frame a different focus setting is used to form the wedges, where in the preferred embodiment the different focus settings are at equal increments in both a first direction and second direction away from the first focus level. Thus, new focus levels for a first group of frames other than frame $30_{F1}$ (i.e.,. the frame at the first focus level) are formed at increments of 0.2 μm in a first direction away from the first focus level (e.g., at +0.2 μm, +0.4 μm, +0.6 μm and so forth relative to the baseline level), and similarly new focus levels for a second group of frames other than frame $30_{F1}$ (i.e.,. the frame at the first focus level) are formed at the same increments of 0.2 μm in a second but opposite direction away from the first focus level (e.g., at −0.2 μm, −0.4 μm, −0.6 μm and so forth relative to the first focus level). As detailed below, the preferred embodiment evaluates the wedges patterned at these different focus levels with the operation of a metrology tool to determine a best focus.

Figure 6C:
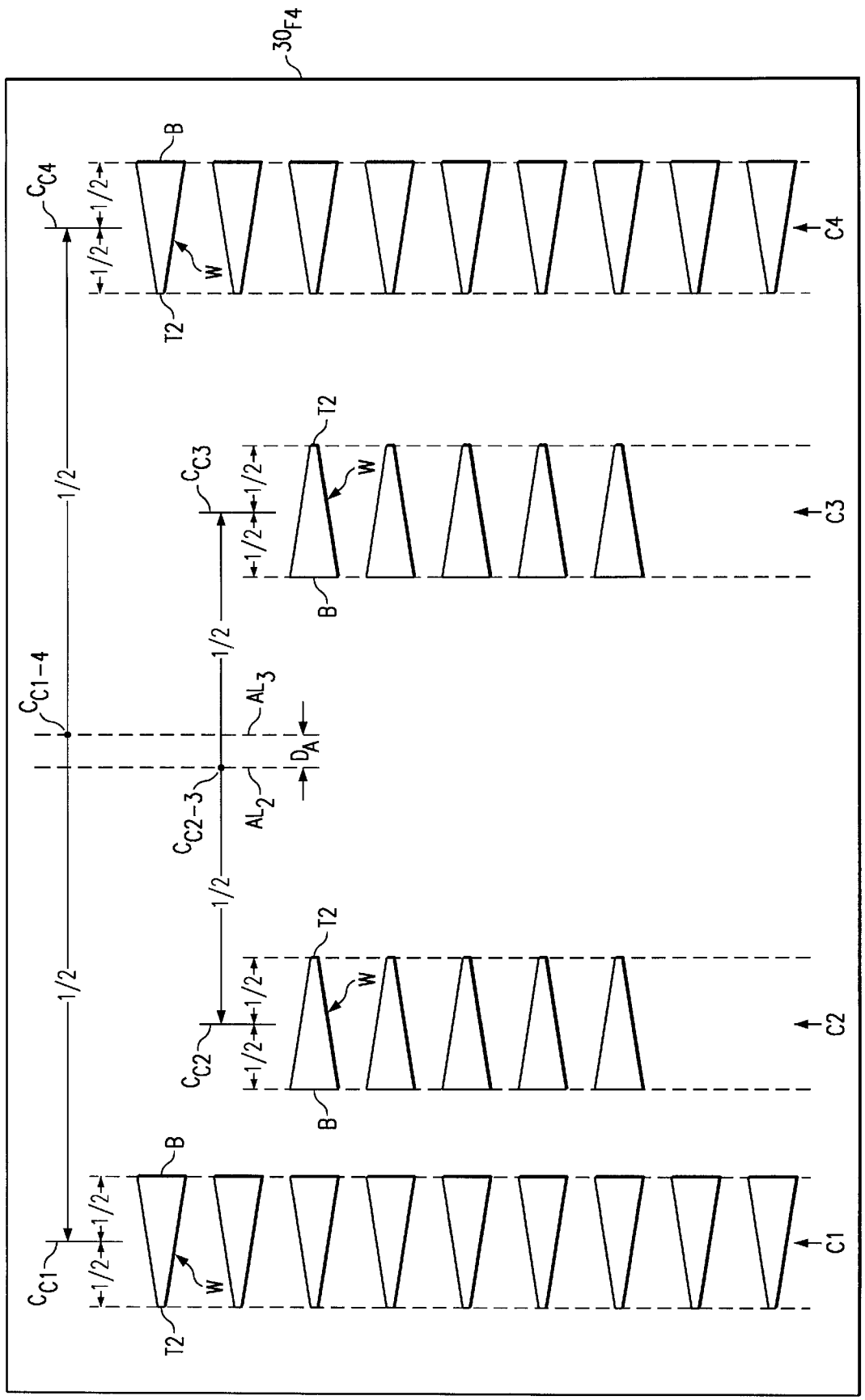
FIG. 6c illustrates the first inventive embodiment of a pattern formed on a wafer of a semiconductor wafer at a second focus level.
Figure 6D:
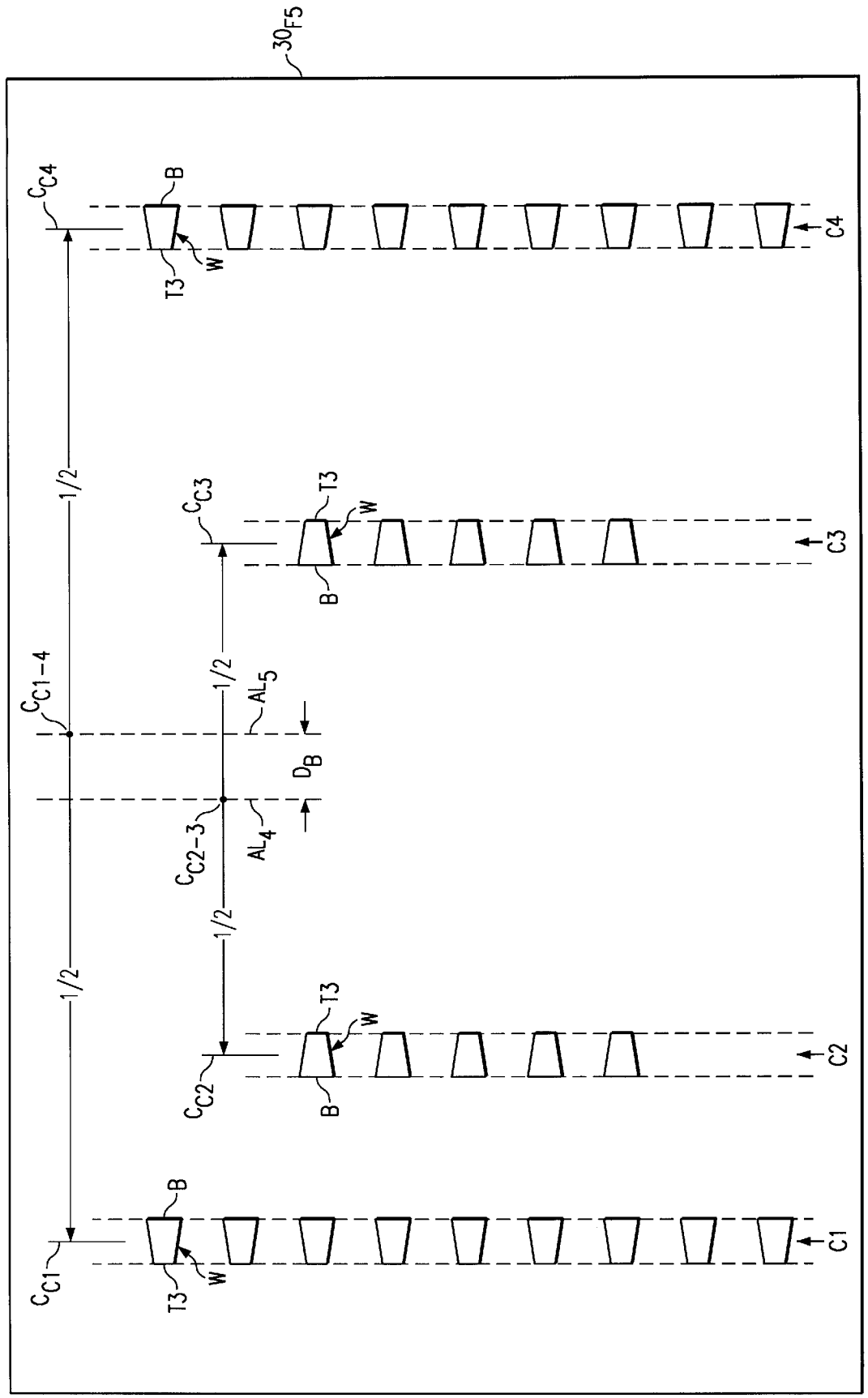
FIG. 6d illustrates the first inventive embodiment of a pattern formed on a wafer of a semiconductor wafer at a third focus level.

By way of example to illustrate patterning in the first direction, FIGS. 6c and 6d illustrate two additional frames $30_{F4}$ and $30_{F5}$, where these frames are patterned at focus levels in the first direction introduced above and, thus, have a positive focus relative to the first focus value used to pattern frame $30_{F1}$ of FIGS. 6a and 6b. For purposes of example, assume that a number of frames are patterned in the first direction at the above-stated increment of 0.2 μm from the preceding frame. Thus, by way of example, assume that a total of four frames $30_{F2}$, $30_{F3}$, $30_{F4}$, and $30_{F3}$, are formed in the first of +0.2 μm greater than the preceding frame, although not all of these frames are illustrated in Figures for the sake of simplifying the discussion. Instead, FIGS. 6c and 6d illustrate frames $30_{F4}$ and $30_{F5}$, respectively, because at some point given the frames patterned in the first direction the wedges will no longer print as full-shaped wedges due to the change in focus away from the first focus value. For the sake of reference, therefore, assume that frame $30_{F4}$ is patterned at a focus level of +0.6 micron greater than the first focus level and frame $30_{F5}$ is patterned at a focus level of +0.8 micron greater than the first focus level. Before further detailing the illustrations of FIGS. 6c and 6d, note that in the same manner as for earlier Figures only the wedges (or a portion of the wedges) actually appear on the formed pattern, while the remaining illustrations (e.g., dashed lines, mid points, center points) are shown for purposes of explaining the preferred embodiment.

Looking to FIG. 6c in greater detail, note that as the focus increases away from the first focus level, such as in the first direction as shown in FIG. 6c, the patterned wedge degrades as compared to a better focus level; in other words, the wedge is not printed to the same extent as it is when a better focus is used, such as shown for the first focus level in FIG. 6a where it appears that the entire wedge is printed. This degradation of shape is viewed by way of example in column C1 of FIG. 6c, where a wedge in that column may be compared to a wedge in column C1 in FIG. 6a. Particularly, given this comparison, it is noted that the pointed tip T1 of the wedge shown in FIG. 6a is not printed in its entirety in FIG. 6c, but instead in FIG. 6c a truncated tip T2 is formed for each wedge. Note further, however, that the base B of each wedge appears the same or substantially the same in both FIGS. 6a and 6c; thus, due to the patterned choice of the wedge shape for each printed element in these Figures, as focus is increased each element tends to degrade from its tip toward its base. This shape degradation occurs for all the wedges in FIG. 6c, and facilitates the preferred embodiment as further detailed below.

The shape degradation introduced above affects the location of the midpoints and center points of frame $30_{F4}$, and as detailed later this further permits determination of the best focus. Looking now to the change in point location, and by way of example looking to column C1 in frame $30_{F4}$, note that the tip truncation causes the dashed line across tips T2 in column C1 to shift to the right relative to the dashed line across tips T in column C1 of FIG. 6a. However, because the bases B in both FIGS. 6a and 6c remain in the same relative location, then the dashed lines across these bases in both FIGS. 6a and 6c remain in the same position. Given the dashed lines for column C1 in FIG. 6c, a midpoint $C_{C1}$ occurs halfway between those dashed lines; however, due to the shifting of the dashed line arising from the truncation of tips T2, this midpoint $C_{C1}$ in FIG. 6c also shifts to the right relative to the midpoint $C_{C1}$ in FIG. 6a.

The right shift of midpoint $C_{C1}$ of column C1 in FIG. 6c introduces aspects that also explain a shift in midpoint $C_{C4}$ of column C4, as now detailed. Particularly, for column C4 in frame $30_{F4}$, the tip truncation also causes the dashed line across tips T2 in column C4 to shift to the right relative to the dashed line across tips T in column C4 of FIG. 6a. Once more, the bases B of the wedges in column C4 in both FIGS. 6a and 6c remain in the same location and, thus, the dashed lines across those bases in both FIGS. 6a and 6c remain in the same position. As a result of the right-shifted dashed line across tips T2 in column C4, and the stationary dashed line across the bases B in column C4, the midpoint $C_{C4}$ occurring halfway between those dashed lines also shifts to the right relative to the midpoint $C_{C4}$ in FIG. 6a.

From the preceding discussion of shifting midpoints one skilled in the art should now readily appreciate a comparable but opposite shift in the midpoints of columns C2 and C3. Particularly, recall it was noted earlier that the pointing direction of the wedges point differs for pairs of columns (e.g., the wedges of columns C1 and C4 point to the left while the wedges columns C2 and C3 point to the right). For this reason and further due to the degradation of tIe wedges from tip toward base, then the shift in the midpoints of columns C2 and C3 is to the left as compared to FIG. 6a. More particularly, turning to column C2 and where its wedges point to the right, the dashed line along bases B of its wedges remains stationary as compared to the comparable dashed line in FIG. 6a, while the dashed line along tips T2 of its wedges shifts to the left. As a result, midpoint $C_{C2}$ in FIG. 6c shifts to the left relative to the comparable midpoint $C_{C2}$ in FIG. 6a. Similarly, since wedges W in column C3 also point to the right, then relative to FIG. 6a the dashed line along bases B of the column C3 wedges in FIG. 6c remains stationary while the dashed line along tips T2 of the column C3 wedges in FIG. 6c shifts to the left. As a result, midpoint $C_{C3}$ in FIG. 6c shifts to the left relative to the comparable midpoint $C_{C3}$ in FIG. 6a.

Having demonstrated the right shift of midpoints $C_{C1}$ and $C_{C4}$ of columns C1 and C4, respectively, and also the left shift of midpoints $C_{C2}$ and $C_{C3}$ of columns C3 and C4, respectively, attention is now directed to the resulting shift in the corresponding center points between those midpoints. Looking first to columns C1 and C4 in FIG. 6c, a center point $C_{C1-4}$ is defined halfway between midpoints $C_{C1}$ and $C_{C4}$, and this center point $C_{C1-4}$ is shifted to the right relative to center point $C_{C1-4}$ in FIG. 6a. Thus, for those columns having wedges pointing in a like direction (e.g., left in the case of columns C1 and C4), the midpoints of those columns shift in the same direction as focus is increased and, hence, the center point between those midpoints also shifts in that same direction. Similarly, therefore, for columns C2 and C3 which both have wedges pointing to the right in FIG. 6c a center point $C_{C2-3}$ is defined halfway between midpoints $C_{C2}$ and $C_{C3}$, and this center point $C_{C2-3}$ is shifted to the left relative to center point $C_{C2-3}$ in FIG. 6a. Lastly, having demonstrated the right shift of center point $C_{C1-4}$ and the left shift of center point $C_{C2-3}$, note that a distance $D_A$ is therefore defined between these center points, as shown between two dashed alignment lines $AL_2$ and $AL_3$ in FIG. 6c. Distance $D_A$ is useful in determining the best focus as further explained below.

Looking now to FIG. 6d, recall that its focus is increased farther away from the first focus level than the focus used in FIG. 6c. As a result, the patterned wedges degrade still further, and once more they do so in a manner that is in the direction from tip toward base. Given the detailed explanations above relating to point shifting in FIG. 6c, some comparable conclusions may now be stated relative to FIG. 6d, where it will be appreciated that the effects are even more pronounced in FIG. 6d due to its larger level of defocus relative to FIG. 6c. More particularly, the increased level of defocus used to form the pattern on frame $30_{F5}$ in FIG. 6d further truncates each wedge, while the portion of each wedge toward its base remains significantly unaffected as compared to the wedge portion toward its tip. As a result, the dashed lines across tips T3 in FIG. 6d shift farther in the same direction they were shown to shift in FIG. 6c. Specifically, with respect to columns C1 and C4 in FIG. 6c, the dashed lines along tips T3 of their wedges W shift farther to the right and, hence, so do midpoints $C_{C1}$ and $C_{C4}$ and, further, so does center point $C_{C1-4}$. With respect to columns C2 and C3 in FIG. 6c, the dashed lines along tips T3 of their wedges W shift farther to the left and, hence, so do midpoints $C_{C2}$ and $C_{C3}$ and, further, so does center point $C_{C2-3}$. Lastly, therefore, a distance $D_B$ may be defined between alignment lines $AL_4$ and $AL_5$ corresponding to center points $C_{C2-3}$ and $C_{C1-4}$, and given the additional farther shifting of the points as just described, one skilled in the art will therefore appreciate that distance $D_B$ of FIG. 6d is greater than distance $D_A$ of FIG. 6c. Distance $D_B$ and its change relative to distance $D_A$ further introduces the preferred method of processing wafer 30, as is further explored below.

FIG. 8 illustrates a flow chart of the preferred method 40 of operation for determining best focus, and is now explored in view of the preferred pattern principles shown in FIGS. 6a through 6d. Prior to beginning method 40, a wafer is patterned with a total of N frames, where each frame is formed with a pattern of wedges formed in columns and in the same directions as shown in the case of FIG. 6a. However, each different frame is formed using a different focus level than the other N-1 frames. By way of example, therefore, assume that N equals 30, thereby giving rises to frames $F_1$ through $F_{30}$, each having a wedge pattern formed at a different focus. Preferably, the focus change from one frame to the next among the N frames is at a uniform level, such as a 0.2 $\mu$m difference.

Turning to method 40 and given the examples introduced immediately above, in the preferred embodiment method 40 is performed by programming a metrology tool to achieve the steps of the method and, from the following one skilled in the art will appreciate that this method of operation is considerably different than the prior art use of a metrology tool for purposes of aligning integrated circuits. Moreover, note that various control apparatus and techniques may be employed to achieve the preferred method steps, such as through the use of computer or other circuit control and, thus, the decision of a given apparatus and programming technique is left to one skilled in the art. Method 40 commences with a step 42, which is intended to illustrate that method 40 has various steps which are repeated for each of the N frames; thus, step 42 initializes the method to start with frame $F_1$ by setting an index I equal to 1. Thereafter, method 40 continues to step 44.

Steps 44 and 46 repeat until all frames on the wafer are evaluated by the metrology tool and associated programming. Step 44 stores the focus value for the frame being analyzed, and step 44 also evaluates that frame and stores its distance D which is the distance between center points for the frame, such as was shown in earlier examples by distances $D_A$ and $D_B$ in FIGS. 6c and 6d, respectively. Thus, when I equals 1, then for frame $F_1$ the focus value $FOCUS_1$ is stored as a parameter $FOCUS_1$. In addition, step 44 evaluates and stores the distance $D_1$ between column center points for frame $F_1$. Step 46 determines whether the index I is less than the total number N of frames to be evaluated; if not, method 40 continues to step 48 which increments index I and returns the flow to step 44 for analysis of the next unanalyzed frame. Once all frames are analyzed, then the index I will equal the total number N of frames to be evaluated, and method 40 continues to step 50.

From the preceding, one skilled in the art should appreciate that when step 50 is reached, then method 40 has stored, for each of the frames patterned on a sample wafer, a distance value $D_X$, where that value is the horizontal distance between the center points of the column pairs of wedges on each frame. Given this information, step 50 identifies which of the N distance values is the lowest value. For example, if method 40 were applied to the frames shown in FIGS. 6b, 6c, and 6d, then step 50 would identify frame $30_{F1}$ of FIG. 6b as having the least horizontal distance between its center points because, as FIG. 6b illustrates, its center points are exactly aligned in the horizontal dimension and hence the horizontal distance between those center points is zero. Once the frame having the lowest distance $D_X$ is identified, the preferred embodiment deems the best focus value to be the focus $FOCUS_X$ corresponding to that frame; accordingly, for the example of applying method 40 to FIGS. 6b, 6c, and 6d, then the focus level used to pattern frame $30_{F1}$ in FIG. 6b (i.e., the first focus level) is deemed to be the best focus.

Having demonstrated a preferred wedge pattern and a method of detecting best focus, two additional observations are helpful at this point. As a first observation, from the preceding one skilled in the art should appreciate that the preferred method of selecting the best focus frame as that frame with the minimal distance $D_X$ effectively provides an automated manner of locating the frame having the least amount of pattern degradation. In other words, assuming that the reticle forming the columns properly aligns columns C2 and C3 with respect to columns C1 and C4, then when the wedges are fully patterned (i.e., with little or no degradation), then their center points horizontally align and it is this instance that will be identified by the preferred embodiment as the instance of best focus. Moreover, note now that this determination is made by a metrology or comparable tool and, therefore, does not introduce the drawbacks associated with manual human analysis as in the case of the prior art. As a second observation, recall earlier that it was noted that the term "first focus" for frame $30_{F1}$ of FIG. 6a was only for sake of reference; thus, note now that the above example where frame $30_{F1}$ using the "first focus" level produced the smallest distance $D_X$ is not meant to suggest that the first frame to be patterned on sample wafer 30 will necessarily be the one with the best focus; instead, this scenario was chosen as only one possible scenario used to simplify the discussion. In an actual implementation of the preferred embodiment, numerous frames are patterned on a sample wafer at numerous respective focus levels, and it may well be that no particular focus level is initially anticipated as the best focus. However, using method 40, each of those frames is analyzed and the frame with the least pattern degradation (i.e., the least distance $D_X$) is identified, and the focus level of that identified frame is then deemed to be the best focus. This best focus is then used to focus the stepper system (or a comparable system) to pattern other wafers in the batch from which the sample wafer was taken.

Figure 9:
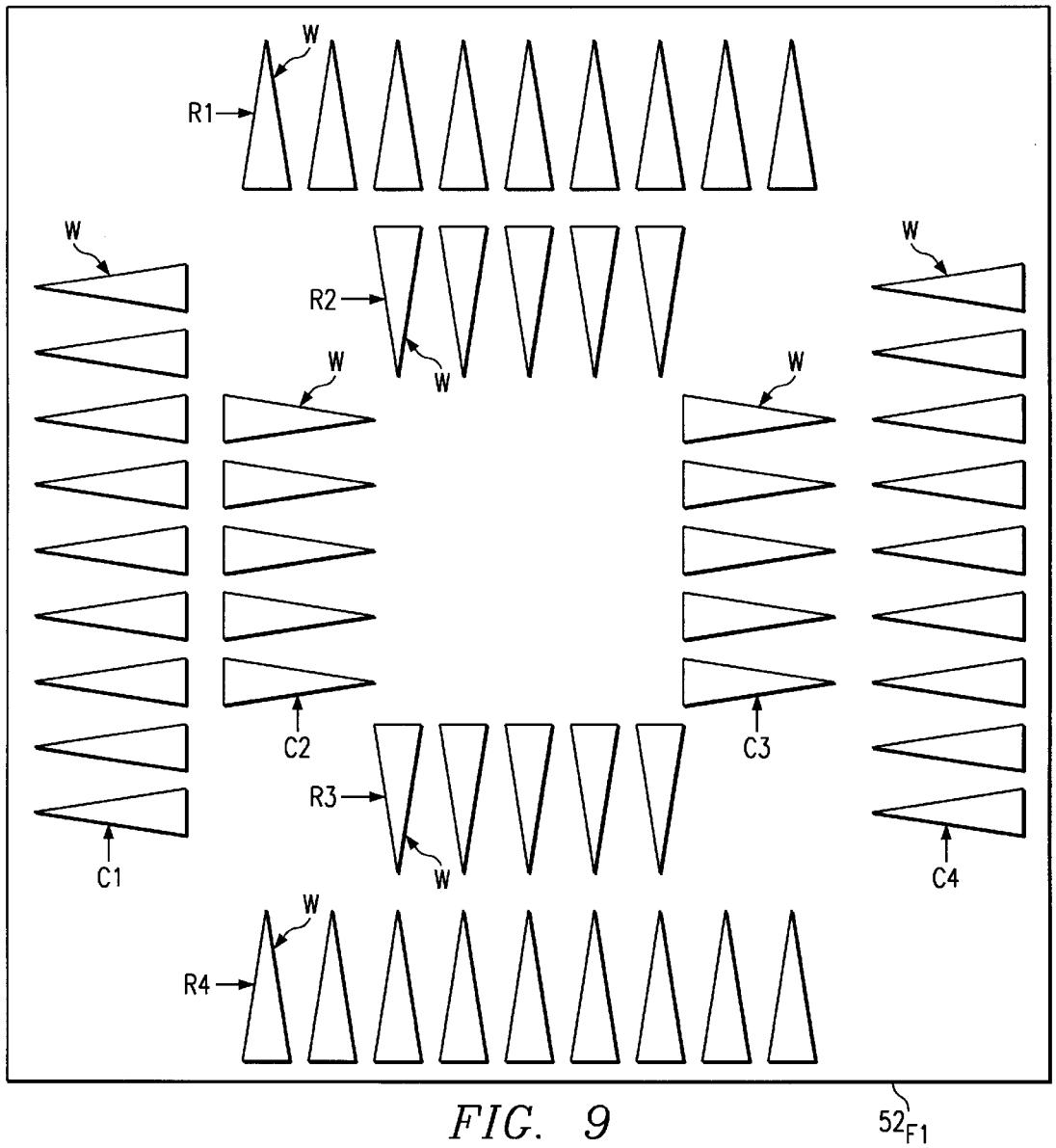
FIG. 9 illustrates a second inventive embodiment of a pattern formed on a wafer of a semiconductor wafer at a first focus level, where the pattern includes wedges formed in the same manner as FIG. 6a, and further includes wedges formed along rows where the wedges in a first pair of the rows point in a first direction and the wedges in a second pair of the rows point in a second direction opposite the first direction.

FIG. 9 illustrates a frame $52_{F1}$ formed on a wafer (not shown in its entirety) and, more particularly, depicts another pattern within the present inventive scope. Specifically, the pattern on frame $52_{F1}$ includes the same four columns C1 through C4 of wedges shown patterned on frame $30_{F1}$ in FIG. 6a, but adds additional wedges in a second dimension; particularly, the wedges of columns C1 through C4 are oriented vertically, while four additional sets of wedges are oriented horizontally and, thus, are referred to in FIG. 9 as rows R1 through R4. As with the column-oriented wedges, note that the row-oriented wedges are formed so that the tips in a first pair of rows (e.g., R1, R4) point in a first direction (e.g., upward) while the tips in a second pair of rows (e.g., R2, R3) point in a second direction (e.g., downward).

The additional wedges shown in the rows of frame $52_{F1}$ provide a second dimension for determining a best focus. More particularly, recall that step 44 of method 40 measures a horizontal distance $D_X$ which, in the examples of the pattern shown in FIGS. 6a–d is the horizontal distance between the center points of vertical columns having wedges pointing in a same direction. However, with the additional row-oriented wedges, a second distance measurement also may be made where this second measurement is the vertical distance between the center points of horizontal rows having wedges pointing in a same direction; thus, with respect to FIG. 9, this second distance measurement would be the vertical distance between the center point of rows R1 and R4 and the center point of rows R2 and R3. Given this additional measurement, an alternative embodiment of the preferred method selects the best focus as the focus used for the frame that is identified as having both a minimum first distance and a rnnimum second distance.

FIG. 10a further illustrates the inventive scope by depicting an alternative element shape $SH_1$ that may be printed on a semiconductor wafer (not shown) at a focus level, and used in method 40 or a variant thereof to determine best focus. For simplicity sake, FIG. 10b illustrates only a single column C5 of shapes $SH_1$, and with only two elements in column C5; however, it should be understood that column C5 may be duplicated in the same general manner as shown in FIG. 6a, whereby four total columns are provided, with one pair of columns having shapes $SH_1$ pointing in one direction and another pair of columns having shapes $SH_1$ pointing in a different and opposite direction. Looking to a specific shape $SH_1$, it includes a base B2 and a tip T4. To demonstrate the alignment of shapes $SH_1$ in column C5, dashed lines are drawn across tips T4 and bases B2 of both shapes in the column. Also in this embodiment, each shape $SH_1$ includes a rectangular portion R1 and a triangular portion TR1, where these portions are separated about a vertical axis $VA_1$ which is half way between the dashed lines across tips T4 and bases B2. Moreover, because vertical axis $VA_1$ is located at the halfway point, then it defines the location of a center point $C_{10a}$ for shapes $SH_1$.

FIG. 10b illustrates the pattern of FIG. 10a but formed on the semiconductor wafer at a different focus level. As with the embodiments of FIGS. 6a through 6d, and due to the change in focus, shapes $SH_1$ degrade more prominently with respect to their tipped ends than their bases. Thus, in FIG. 10b, truncated tips T5 are shown for each hape $SH_1$, while bases B2 are relatively unaffected due to the change in focus. Given he degradation of shapes $SH_1$ in FIG. 10b, a new half way point is defined between the dashed lines along truncated tips T5 and bases B2, which therefore defines a newly-located center point $C_{10b}$. More particularly, since the dashed line across tips T5 moves to the right relative to the dashed line across tips T4 in FIG. 10a, then center point $C_{10b}$ is located to the right of center point $C_{10a}$; indeed, to illustrate this aspect further, center point $C_{10a}$ is also shown in FIG. 10b. Concluding the discussion of FIG. 10b, note that the change in location of the center points of the FIGS. 10a ad 10b may be measured by a distance $D_{10ab}$. As a result, one skilled in the art should appreciate that shapes $SH_1$ may be used in a comparable manner to wedges W described earlier, whereby the distance between center points is measured and stored for various different frames formed using shapes $SH_1$ in different focus levels and in opposing pointing directions, whereby the focus level of the frame having the smallest distance between its center points corresponds to the best focus.

The alternative pattern shape $SH_1$ of FIGS. 10a and 10b further illustrates that, like FIGS. 6a through 6d, the element here (i.e., shape $SH_1$) includes only one pointed portion that points in a direction that is perpendicular relative to the directionality of its group. For example, in FIG. 10a column C5 of shapes $SH_1$ is vertical, as further depicted by vertical axis $VA_1$. Further, each shape $SH_1$ in column C5 includes a triangle portion TR1 (either fully or truncated) that points to a direction (i.e., horizontal) that is perpendicular relative to vertical axis $VA_1$. This aspect is not required of all implementations of the present embodiments, but it useful in that it provides a pattern of elements where each element, when patterned in a focus that is not the best focus, will degrade in a predictable direction. In other words, when a pointed tip is used in this manner, and as the shape is patterned to a greater degree of defocus, then the resulting pattern will degrade more prominently from one end rather than its non-pointed end, and the direction of degradation will be toward the axis of the directionality of the group. As a result, when these shapes are paired in columns whereby one pair of columns points in one direction and another pair points in an opposite direction, then a best focus determination will be available by finding the minimum distance between the two center points corresponding to the two paired columns.

From the preceding demonstrations regarding alternative shapes within the present inventive scope, note further that still other variations of the present embodiments may be derived given the teachings of this document. For example, other element shapes may be used, whereby in response to a change in focus there is pattern degradation which occurs at both ends of the shape, but in a predictable manner whereby one end (or portion) of the shape degrades at a faster rate than the other end (or portion) of the shape. Where two or more of these elements are aligned in a given direction, this goal may be achieved so long as the element shape is asymmetric about an axis passing in the given direction and through the midpoint of the elements. By way of example, therefore, FIGS. 11a and 11b illustrate additional shapes, where an axis is drawn vertically and halfway between the ends of the shape, and the shape is asymmetric about that axis. Clearly, numerous other examples may be ascertained by one skilled in the art in view of the above.

Five final observations are noteworthy with respect to the elements patterned within the present embodiments, and such observations provide potential variation to the preceding aspects. Accordingly, each is addressed below, and it should be noted that each may be combined with other teachings of this document to produce a number of various embodiments within the present inventive scope.

As a first observation, while FIGS. 6a through 6d and FIG. 9 illustrate a certain number of elements (e.g., five or nine) in a group, it should be understood that the actual number of elements may vary according to various considerations. For example, the numbers shown above may be useful in defining consistent edges of shapes for analysis by a metrology tool, but changes in metrology or comparable tool technology may permit fewer numbers of elements in a given group and, indeed, a distance measurement may be ascertainable in some instances using only one element per group (i.e., one element pointing in one direction).

As a second observation, while earlier Figures also illustrate elements of the same shape and size pointing in exact opposite directions, an alternative is to have a first group of elements of one size and/or shape but having a predictable degradation in response to focus level change, and a second group of elements of a different size and/or shape and also with a predictable degradation in response to focus level change.

As a third observation, while earlier Figures also illustrate elements pointing in exact opposite directions, again changes in metrology or comparable tool technology may permit elements to point in a first and second direction that are not exact opposites of one another. In this instance, the predictability of the degradation of each element also will give rise to a predictable movement of the center point defined by the element. As a result, this predictable movement may be tracked using the metrology (or comparable) tool such that a particular location of a first center point (corresponding to the first direction) and relative to a second center point (corresponding to the second direction) corresponds to a best focus.

As a fourth observation, while earlier Figures illustrate elements in pairs of columns or row, an alternative embodiment arises using simply a first group (i.e., one or more) of elements patterned to degrade in a first direction and a second group (i.e., one or more) of elements patterned to degrade in a second direction differing from the first direction. Each of these groups will have an identifiable midpoint, just as the columnns or rows are shown to have a midpoint in earlier Figures. Accordingly, as the elements are patterned at focus levels farther from the best focus level, they will degrade and their corresponding midpoints will move relative to one another. Thus, in this case there is no additional center point between pairs of groups, but the movement of the midpoints alone provides a basis which may be analyzed to determine the location of one midpoint relative to the other which provides a best focus example.

As a fifth and final observation, the preceding discussion in all instances has used a half way point (i.e., either midpoint or center point) as the basis for tracking the pattern degradation; this choice is preferable given the capabilities of current metrology tools for identifying the location of these points. However, one skilled in the art may now or in the future implement apparatus which could associate a different point with an element that has a predictable degrading aspect when patterned out of focus, whereby this different point moves location in response to the degradation, and this different point may then be used as a reference point to be compared against a reference point from another predictably degrading element for selecting best focus when the two points are positioned relative to one another in a predictable manner.

From the above, it may be appreciated that the above embodiments provide numerous advantages over the prior art, and the preceding demonstrates numerous alternatives for accomplishing these advantages. Looking first to some of the advantages, note that the preferred embodiments are achieved using an automated apparatus, such as a programmed stepper to form the desired patterns and a programmed metrology tool to select the best focus. As a result, there is no human subjective evaluation as there is with many prior art approaches and, hence, uniformity and accuracy in best focus evaluation is improved. As another advantage, the preferred embodiment is not limited to certain sigma size applications as is the phase shifted reticle technique described earlier. As still another advantage, the preceding has demonstrated numerous alternatives that may be included within the preferred embodiment, thereby providing added flexibility based on various implementations and other considerations ascertainable by one skilled in the art. Consequently, while the present embodiments have been described in detail, various substitutions, modifications or alterations could be made to the descriptions set forth above without departing from the inventive scope which is defined by the following claims.

What is claimed is:

1. A method of determining a best focus for an integrated circuit stepper, comprising the steps of:

for a plurality of different focus levels, the steps of:

forming a first element group on a wafer, wherein the first element group comprises one or more elements and each of the one or more elements in the first element group has a shape;

defining a first reference point for the first element group at a position relative to the shape of the one or more elements in the first element group;

forming a second element group on the wafer, wherein the second group comprises one or more elements and each of the one or more elements in the second element group has a shape;

defining a second reference point for the second element group at a position relative to the shape of the one or more elements in the second element group;

measuring a distance between the first reference point and the second reference point such that a distance measurement is identified for each of the plurality of different focus levels; and selecting as the best focus a focus level from the plurality of different focus levels and corresponding to a selected one of the distance measurements.

2. The method of claim 1 wherein the shape of the one or more elements in the first element group is a same shape as the shape of the one or more elements in the second element group.

3. The method of claim 1:

wherein the one or more elements in the first element group comprise a plurality of elements formed in a first direction of orientation; and wherein the shape of the one or more elements in the first element group is asymmetric relative to the first direction of orientation.

4. The method of claim 1:

wherein the one or more elements in the first element group comprise a plurality of elements formed in a first direction of orientation; and wherein the shape of the one or more elements in the first element group comprises a pointed portion aligned to point in a direction that is perpendicular to the first direction of orientation.

5. The method of claim 1:
wherein the one or more elements in the first element group comprises:
   a first set of a plurality of elements formed in a first direction of orientation; and
   a second set of a plurality of elements formed in the first direction of orientation but not co-aligned with the first set-of plurality of elements; and
wherein the shape of the one or more elements in the first element group comprises a pointed portion aligned to point in a direction that is perpendicular to the first direction of orientation.

6. The method of claim 5:
wherein the one or more elements in the second element group comprises:
   a first set of a plurality of elements formed in a second direction of orientation; and
   a second set of a plurality of elements formed in the second direction of orientation but not co-aligned with the first set of plurality of elements formed in the second direction of orientation; and
wherein the shape of the one or more elements in the second element group comprises a pointed portion aligned to point in a direction that is perpendicular to the to second direction of orientation and different than the direction that is perpendicular to the first direction of orientation.

7. The method of claim 6 wherein the step of selecting as the best focus comprises selecting a focus level from the plurality of different focus levels that has a corresponding distance measurement that is less than all other of the distance measurements.

8. The method of claim 6:
wherein the shape of the one or more elements in the first element group comprises a wedge; and
wherein the shape of the one or more elements in the second element group comprises a wedge.

9. The method of claim 6 wherein the shape of the one or more elements in the second element group comprises a pointed portion aligned to point in a direction that is perpendicular to the second direction of orientation and opposing the direction that is perpendicular to the first direction of orientation.

10. The method of claim 6:
wherein a first midpoint is defined for the first set of a plurality of elements in the first element group, wherein the first midpoint for the first set of a plurality of elements in the first element group is half way between a first line in the first direction of orientation and along a first edge of each of the plurality of elements in the first set of the first element group and a second line in the first direction of orientation and along a second edge of each of the plurality of elements in the first set of the first element group;
wherein a second midpoint is defined for the second set of a plurality of elements in the first element group, wherein the second midpoint for the second set of a plurality of elements in the first element group is half way between a first line in the first direction of orientation and along a first edge of each of the plurality of elements in the second set of the first element group and a second line in the first direction of orientation and along a second edge of each of the plurality of elements in the second set of the first element group; and
wherein the first reference point is halfway between the first midpoint for the first set of a plurality of elements in the first element group and the second midpoint for the second set of a plurality of elements in the first element group.

11. The method of claim 10:
wherein a first midpoint is defined for the first set of a plurality of elements in the second element group, wherein the first midpoint for the first set of a plurality of elements in the second element group is half way between a first line in the second direction of orientation and along a first edge of each of the plurality of elements in the first set of the second element group and a second line in the second direction of orientation and along a second edge of each of the plurality of elements in the first set of the second element group;
wherein a second midpoint is defined for the second set of a plurality of elements in the second element group, wherein the second midpoint for the second set of a plurality of elements in the second element group is half way between a first line in the second direction of orientation and along a first edge of each of the plurality of elements in the second set of the second element group and a second line in the second direction of orientation and along a second edge of each of the plurality of elements in the second set of the second element group; and
wherein the second reference point is halfway between the first midpoint for the first set of a plurality of elements in the second element group and the second midpoint for the second set of a plurality of elements in the second element group.

12. The method of claim 11 wherein the shape of the one or more elements in the second element group comprises a pointed portion aligned to point in a direction that is perpendicular to the second direction of orientation and opposing the direction that is perpendicular to the first direction of orientation.

13. The method of claim 12:
wherein the shape of the one or more elements in the first element group comprises a wedge; and
wherein the shape of the one or more elements in the second element group comprises a wedge.

14. The method of claim 12:
wherein the shape of the one or more elements in the first element group is such that, in response to being formed at a different one of the plurality of different focus levels, a first portion of the shape of the first element group degrades at a faster rate than a second portion of the shape of the first element group; and
wherein the shape of the one or more elements in the second element group is such that, in response to being formed at a different one of the plurality of different focus levels, a first portion of the shape of the second element group degrades at a faster rate than a second portion of the shape of the second element group.

15. The method of claim 1:
wherein the shape of the one or more elements in the first element group comprises a wedge; and
wherein the shape of the one or more elements in the second element group comprises a wedge.

16. The method of claim 1:
wherein the shape of the one or more elements in the first element group is such that, in response to being formed at a different one of the plurality of different focus levels, a first portion of the shape of the first element group degrades at a faster rate than a second portion of the shape of the first element group; and wherein the shape of the one or more elements in the second element group is such that, in response to being formed at a different one of the plurality of different focus levels, a first portion of the shape of the second element group degrades at a faster rate than a second portion of the shape of the second element group.

17. The method of claim 1 wherein the forming steps are achieved by patterning the first element group and the second element group on the wafer using the integrated circuit stepper.

18. The method of claim 17 wherein the measuring steps are achieved using a metrology tool.

19. The method of claim 1 wherein the measuring steps are achieved using a metrology tool.

20. The method of claim 1:

wherein a first midpoint is defined for the first element group, wherein the first midpoint for the first element group is half way between a first line in a first direction of orientation and along a first edge of each of the one or more elements in the first element group and a second line in the first direction of orientation and along a second edge of each of the one or more elements in the first set element group;

wherein a second midpoint is defined for the second element group, wherein the second midpoint for the second element group is half way between a first line in a second direction of orientation and along a first edge of each of the one or more elements in the second element group and a second line in the second direction of orientation and along a second edge of each of the one or more elements in the second element group;

wherein the first reference point is the first midpoint; and wherein the second reference point is the second midpoint.

* * * * *